United States Patent
Park et al.

(10) Patent No.: US 9,837,933 B2
(45) Date of Patent: *Dec. 5, 2017

(54) ENERGY HARVESTER USING MASS AND MOBILE DEVICE INCLUDING THE ENERGY HARVESTER

(71) Applicant: SAMSUNG ELECTRONICS CO., LTD., Gyeonggi-do (KR)

(72) Inventors: Young-jun Park, Suwon-si (KR); Jin S. Heo, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 366 days.

This patent is subject to a terminal disclaimer.

(21) Appl. No.: 14/540,622

(22) Filed: Nov. 13, 2014

(65) Prior Publication Data

US 2015/0061464 A1 Mar. 5, 2015

Related U.S. Application Data

(63) Continuation-in-part of application No. 14/080,318, filed on Nov. 14, 2013, now Pat. No. 9,444,031.

(30) Foreign Application Priority Data

Jun. 28, 2013 (KR) .................. 10-2013-0075942
May 21, 2014 (KR) .................. 10-2014-0061166

(51) Int. Cl.
*H02N 1/04* (2006.01)
*H02N 2/18* (2006.01)
*H01L 41/113* (2006.01)

(52) U.S. Cl.
CPC ............. *H02N 1/04* (2013.01); *H01L 41/113* (2013.01); *H02N 2/186* (2013.01)

(58) Field of Classification Search
CPC ......... H02N 1/04; H02N 2/186; H01L 41/113
USPC ..................................... 310/339, 329
See application file for complete search history.

(56) References Cited

U.S. PATENT DOCUMENTS

| | | | |
|---|---|---|---|
| 4,106,279 A | 8/1978 | Martin et al. | |
| 6,586,095 B2 | 7/2003 | Wang et al. | |
| 6,911,764 B2 | 6/2005 | Pelrine et al. | |
| 8,588,248 B2 | 11/2013 | Park et al. | |
| 9,419,544 B2* | 8/2016 | Kim .................. | H02N 2/18 |
| 2007/0278902 A1* | 12/2007 | Rastegar .............. | F21L 13/00 |
| | | | 310/339 |

(Continued)

FOREIGN PATENT DOCUMENTS

| | | |
|---|---|---|
| KR | 1020100098287 A | 9/2010 |
| KR | 10-1007197 B1 | 1/2011 |

(Continued)

*Primary Examiner* — Bryan Gordon
(74) *Attorney, Agent, or Firm* — Sughrue Mion, PLLC

(57) ABSTRACT

Provided are an energy harvester using a mass, and a mobile device including the energy harvester. The energy harvester includes: a mass; first and second substrates spaced apart from each other, wherein one of the first and second substrates is connected to the mass; first and second electrodes provided on the first and second substrates; and an energy generator provided between the first and second electrodes, wherein the energy generator generates electric energy upon a relative movement between the first substrate and the second substrate caused by a movement of the mass.

27 Claims, 17 Drawing Sheets

(56) References Cited

U.S. PATENT DOCUMENTS

| | | |
|---|---|---|
| 2009/0066195 A1 | 3/2009 | Wang et al. |
| 2009/0069045 A1* | 3/2009 | Cheng .................. H02J 7/0042 |
| | | 455/556.1 |
| 2009/0115293 A1 | 5/2009 | Wang et al. |
| 2010/0117488 A1* | 5/2010 | Wang ...................... H02N 2/18 |
| | | 310/339 |
| 2010/0221060 A1 | 9/2010 | Yu |
| 2010/0253184 A1* | 10/2010 | Choi ...................... H02N 2/18 |
| | | 310/339 |
| 2011/0084345 A1* | 4/2011 | Park ...................... B82Y 10/00 |
| | | 257/415 |
| 2011/0220391 A1 | 9/2011 | Oka et al. |
| 2012/0007470 A1* | 1/2012 | Kurihara ............. H01L 41/1136 |
| | | 310/329 |
| 2012/0087297 A1 | 4/2012 | Park et al. |
| 2012/0223617 A1* | 9/2012 | Kim ...................... H02N 2/186 |
| | | 310/319 |
| 2013/0162192 A1 | 6/2013 | Park et al. |
| 2014/0028569 A1* | 1/2014 | Guard .................... G06F 3/044 |
| | | 345/173 |
| 2014/0138672 A1 | 5/2014 | Park et al. |

FOREIGN PATENT DOCUMENTS

| | | |
|---|---|---|
| KR | 10-2011-0135293 A | 12/2011 |
| KR | 10-1146439 B1 | 5/2012 |
| KR | 10-2012-0068348 A | 6/2012 |
| KR | 10-2012-0100294 A | 9/2012 |
| KR | 10-2013-0016674 A | 2/2013 |
| KR | 1020140063299 A | 5/2014 |

* cited by examiner

ENERGY HARVESTER USING MASS AND MOBILE DEVICE INCLUDING THE ENERGY HARVESTER

CROSS-REFERENCE TO RELATED APPLICATIONS

This application is a Continuation-in-Part of U.S. patent application Ser. No. 14/080,318, filed on Nov. 14, 2013, which claims priority from Korean Patent Application No. 10-2013-0075942, filed on Jun. 28, 2013; and this Continuation-In-Part application further claims priority from Korean Patent Application No. 10-2014-0061166, filed on May 21, 2014, the disclosures of all of which are incorporated herein in their entirety by reference.

BACKGROUND

1. Field

Apparatuses consistent with exemplary embodiments relate to energy harvesters using a mass, and mobile devices including the energy harvesters.

2. Description of the Related Art

Recently, the use of smart phones has become widespread, and various attempts are being made to provide mutual control between a smart phone and a peripheral device. In particular, extensive research is being conducted into a smart watch that is a combination of a smart phone and a watch, and some prototypes thereof are being commercialized. Smart watches are being used as wristwatches to control or monitor functions, such as a call function, a message function, or an application of a smart phone. However, since such smart watches consume much more power than typical wristwatches, the smart watches need to be charged often or should be equipped with a high-capacity battery in order to be always supplied with power.

SUMMARY

Provided are energy harvesters using a mass, and mobile devices including the energy harvesters.

Additional aspects will be set forth in part in the description which follows and, in part, will be apparent from the description, or may be learned by practice of the presented embodiments.

According to an aspect of an exemplary embodiment, an energy harvester includes: a mass; first and second substrates spaced apart from each other, wherein one of the first and second substrates is connected to the mass; first and second electrodes provided on the first and second substrates; and an energy generator provided between the first and second electrodes, wherein the energy generator generates electric energy by using a mechanical force applied by a movement of the mass.

The first and second substrates each may have a band-type structure, a flat-plate structure, or a core-shell structure.

The energy generator may include at least one of a piezoelectric generator and a triboelectric generator.

The energy generator may include a plurality of piezoelectric nanowires provided between the first and second electrodes. Herein, the energy generator may further include a dielectric film provided between the second electrode and the piezoelectric nanowires.

The energy generator may include a piezoelectric thin-film layer provided between the first and second electrodes. The energy generator may include: a first triboelectric layer provided on the first electrode and including a first dielectric or a metal; and a second triboelectric layer provided on the second electrode and including a second dielectric that is different from the first dielectric. A plurality of first protrusions may be formed on a surface of the first triboelectric layer, and a plurality of second protrusions may be formed on a surface of the second triboelectric layer. The first triboelectric layer may include a plurality of first wires provided on the first electrode, and the second triboelectric layer may include a plurality of second wires provided on the second electrode. The first triboelectric layer may include a plurality of first lines provided on the first electrode in parallel to each other, and the second triboelectric layer may include a plurality of second lines provided on the second electrode in parallel to each other. The first triboelectric layer may include a plurality of first lines provided radially on the first electrode, and the second triboelectric layer may include a plurality of second lines provided radially on the second electrode.

At least one spacer may be provided between the first and second substrates to maintain a distance between the first and second substrates.

According to an aspect of another exemplary embodiment, an energy harvester includes: a substrate having a tube shape and a cavity formed therein; a triboelectric layer provided on an inner surface of the substrate; at least one first electrode and at least one second electrode provided outside or inside the substrate; and at least one mass provided to be movable in the cavity inside the triboelectric layer.

The substrate may have, for example, a circular tube shape or a square tube shape, and the mass may have, for example, a circular pillar shape, a square pillar shape, a circular tube shape, or a ball shape.

The first and second electrodes may be provided alternately along a longitudinal direction of the substrate. One of the triboelectric layer and the mass may include a first dielectric or a metal, and the other of the triboelectric layer and the mass may include a second dielectric that is different from the first dielectric.

According to an aspect of another exemplary embodiment, a mobile device includes: a mobile device body; a support supporting the mobile device body; and an energy harvester provided in at least one of the mobile device body and the support, wherein the energy harvester generates electric energy by using a mechanical force applied from outside.

The energy harvester may be provided inside or outside at least one of the mobile device body and the support. The support may include a band-type structure or a flat-plate structure.

The support may include a plurality of energy harvesters that are connected in parallel to each other. The energy harvesters may be connected in series with each other.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Figure 1:
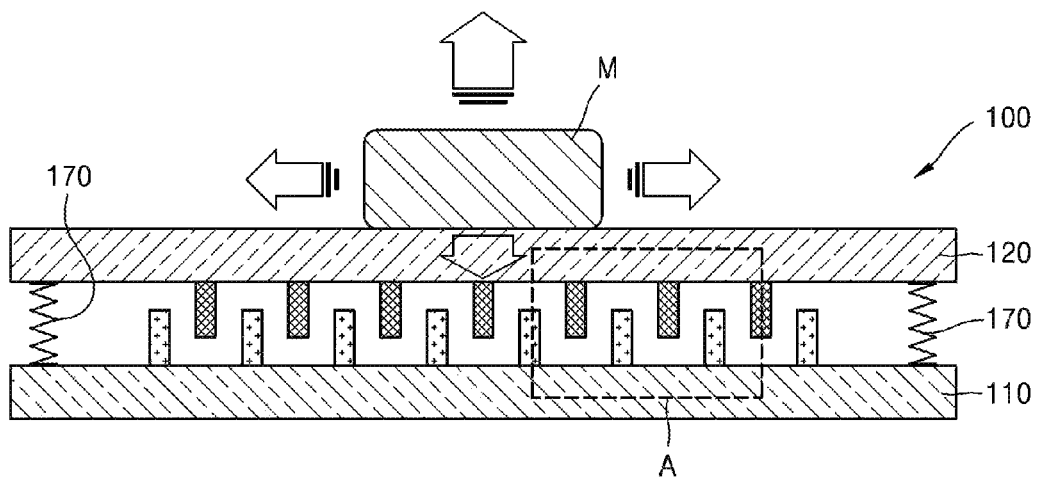
FIG. 1 is a cross-sectional view of a mobile device including an energy harvester according to an exemplary embodiment.

Reference will now be made in detail to embodiments, examples of which are illustrated in the accompanying drawings, wherein like reference numerals refer to like elements throughout. In this regard, the exemplary embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, exemplary embodiments will be described in detail with reference to the accompanying drawings. The exemplary embodiments described below should be considered in a descriptive sense only and not for purposes of limitation. In the drawings, like reference numerals denote like elements, and the sizes or thicknesses of elements are exaggerated for clarity. It will also be understood that when a layer is referred to as being "on" another layer or substrate, it may be directly on the other layer or substrate, or intervening layers may also be present. In the following embodiments, a material forming each layer is merely exemplary, and other materials may also be used.

Figure 2:
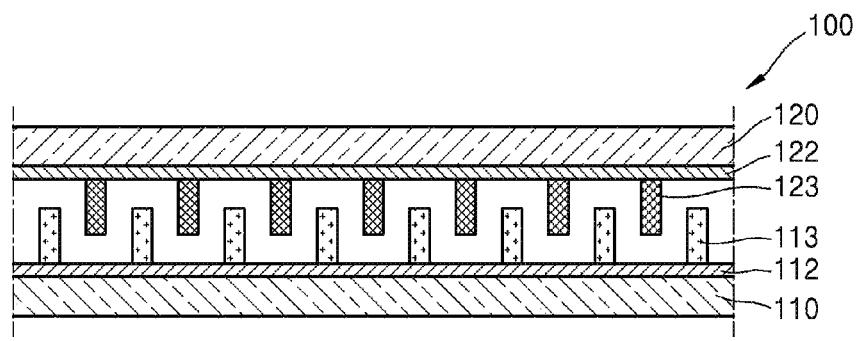
FIG. 2 is an enlarged view of a portion A of FIG. 1.

FIG. 1 is a cross-sectional view of a mobile device including an energy harvester according to an exemplary embodiment. FIG. 2 is an enlarged view of a portion A of FIG. 1.

Referring to FIGS. 1 and 2, the mobile device includes a mass M and an energy harvester 100 configured to generate electric energy by the movement of the mass M. The mobile device may be, for example, a device attached to a human body, but is not limited thereto. The mass M is a mobile device body. Alternately, the mass M may be an object other than the mobile device body. The mass M is connected to the energy harvester 100 to apply a mechanical force to the energy harvester 100 by the movement thereof. The energy harvester 100 generates electric energy by using the mechanical force applied by the movement of the mass M.

The energy harvester 100 may have a flat-plate structure. In detail, the energy harvester 100 includes: first and second substrates 110 and 120 spaced apart from each other; first and second electrodes 112 and 122 provided on the first and second substrates 110 and 120; and an energy generator provided between the first and second electrodes 112 and 122. At least one of the first and second substrates 110 and 120 may be connected to the mass M. FIG. 1 illustrates a case where the mass M is connected to the second substrate 120. In other examples, the mass M may be connected to the first substrate 110, or may be connected to the first and second substrates 110 and 120.

The first and second substrates 110 and 120 may each have a flat-plate structure. For example, each of the first and second substrates 110 and 120 may include a wafer or a hard material such as glass, or may include a flexible material such as plastic, textile, fiber, or metal foil. However, this exemplary embodiment is not limited thereto, and the first and second substrates 110 and 120 may include various other materials. The first electrode 112 is provided on the top surface of the first substrate 110, and the second electrode 122 is provided on the bottom surface of the second substrate 120. For example, the first and second electrodes 112 and 122 may include graphene, carbon nanotube (CNT), indium tin oxide (ITO), metal, or conductive polymer. However, this exemplary embodiment is not limited thereto. The metal may include, for example, silver (Ag), aluminum (Al), copper (Cu), or gold (Au), and may also include other materials.

The energy generator is provided between the first and second electrodes 112 and 122. The energy generator may be a triboelectric generator that generates electric energy by two layers, which are formed of different materials, rubbing against each other, due to the mechanical force generated by the movement of the mass M or changing a distance between the two layers. The triboelectric generator includes: a first triboelectric layer 113 provided on the first electrode 112; and a second triboelectric layer 123 provided on the second electrode 122.

The first triboelectric layer 113 may include a first dielectric or a metal, and the second triboelectric layer 123 may include a second dielectric that is different from the first dielectric. The first triboelectric layer 113 may include a material that tends to be positively charged, such as, for example, polyformaldehyde, ethylcellulose, polyamide, wool, silk, Al, paper, cotton, steel, wood, nickel (Ni), Cu, Ag, or polyvinyl alcohol (PVA). The second triboelectric layer 123 may include a material that tends to be negatively charged, such as silicon rubber, teflon, polydimethylsiloxane (PDMS), kapton, polypropylene (PP), polyethylene (PE), or polyvinyl chloride (PVC). Also, the second triboelectric layer 123 may include piezoelectric materials such as ferroelectrics or electrets. Herein, the electrets may include, for example, flouropolymers, polyvinylfluoride (PVF), polyvinylidene fluoride (PVDF), polychlorotrifluoroethylene (PCTFE), perfluoroalkoxy polymer (PFA), fluorinated ethylene propylene (FEP), polyethylenetetrafluoroethylene (ETFE), polyethylene terephthalate (PET), or quartz. However, this exemplary embodiment of is not limited thereto. For example, the first triboelectric layer 113 may include a material that tends to be negatively charged, and the second triboelectric layer 123 may include a material that tends to be positively charged. The first and second triboelectric layers 113 and 123 may include different materials that have a large difference in their degree of charging. The first triboelectric layer 113 and the second triboelectric layer 123 are spaced apart from each other by a predetermined distance after being charged by direct contact caused by an external pressure. Due to the mechanical force caused by the movement of the mass M, the first and second triboelectric layers 113 and 123 may rub against each other or the distance therebetween may be changed. In this case, a charge density difference may occur between the first and second triboelectric layers 113 and 123, thereby generating electric energy. A distance between the first and second triboelectric layers 113 and 123 may be, for example, about 0 mm to about 10 mm and may be about 0 mm to about 1 mm. However, embodiments are not limited thereto.

The first triboelectric layer 113 may include a plurality of first wires provided on the top surface of the first electrode 112, and the second triboelectric layer 123 may include a plurality of second wires provided on the bottom surface of the second electrode 122. The second wires are spaced apart from the first wires, and the first and second wires may be disposed alternately with each other. The first and second wires may have, for example, a nano-wire shape or a micro-wire shape, but are not limited thereto. The first and second wires each may have a diameter of about 1 nm to about 1 mm. The first and second wires may be formed by photolithographic patterning, plasma etching, three-dimensional (3D) printing, thin film transfer, coating, nano-imprinting, or direct growth. When the first and second triboelectric layers 113 and 123 include the first and second wires disposed alternately with each other, the energy harvester 100 may react to a minute external force, and the area of a dielectric interface, at which friction is generated, may be increased, thus making it possible to generate electric energy more efficiently.

The energy harvester 100 may further include at least one spacer 170 provided between the first and second substrates 110 and 120. The spacer 170 functions to maintain a constant distance between the first substrate 110 and the second substrate 120. For example, the spacer 170 may include an elastic material, such as a spring or rubber, or a magnetic material, such as a magnet. However, this exemplary embodiment is not limited thereto. When at least one spacer 170 is disposed between the first and second substrates 110 and 120, the mechanical force caused by the movement of the mass M is more effectively transmitted to the energy harvester 100 to generate electric energy.

In the above-described mobile device, when the mobile device body that is the mass M is moved horizontally or vertically, a mechanical force caused by the movement of the mass M is applied to the energy harvester 100. Due to the mechanical force, the first and second triboelectric layers 113 and 123 may rub against each other or the distance therebetween may be changed. Accordingly, a charge density difference may occur between the first and second triboelectric layers 113 and 123, thereby generating electric energy. As in this embodiment, when the first and second triboelectric layers 113 and 123 include the first and second wires disposed alternately with each other, the energy harvester 100 may react to a minute movement of the mass M in various directions, and the area of a dielectric interface, at which friction is generated, may be increased, thus making it possible to generate electric energy more efficiently. The generated electric energy may be supplied to the mobile device body that is the mass M, or may be stored in a battery. An exemplary case where the energy harvester 100 has a single-layer structure including one triboelectric generator has been described above. However, the energy harvester 100 may also have a multi-layer structure including a stack of a plurality of triboelectric generators. The external environment applicable to the energy harvester 100 according to an exemplary embodiment may include, for example, movement of a human body, mechanical vibration, wind, vibration of a rotating body, water flow, or electromagnetic vibration.

Figure 3:
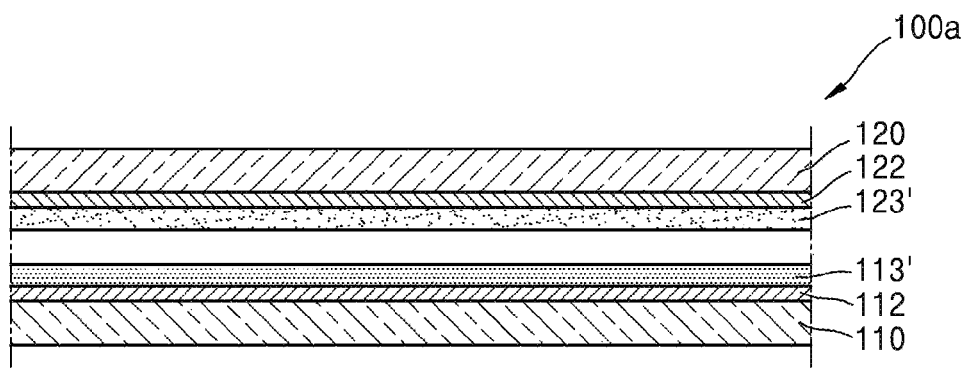
FIG. 3 is a cross-sectional view of an energy harvester according to another exemplary embodiment.

FIG. 3 is a cross-sectional view of an energy harvester 100a according to another exemplary embodiment. FIG. 3 is an enlarged view of a cross-section of an energy harvester 100a that is a modification of the energy harvester 100 illustrated in FIGS. 1 and 2, and the same is true of the following drawings. Only differences from the above-described embodiment will be mainly described hereinafter.

Referring to FIG. 3, the energy harvester 100a includes: first and second substrates 110 and 120 spaced apart from each other; first and second electrodes 112 and 122 provided on the first and second substrates 110 and 120; and an energy generator provided between the first and second electrodes 112 and 122. At least one of the first and second substrates 110 and 120 may be connected to the mass M. Since the first and second substrates 110 and 120 and the first and second electrodes 112 and 122 have been described above, a description thereof will be omitted here.

The energy generator is provided between the first and second electrodes 112 and 122. The energy generator may be a triboelectric generator. The triboelectric generator includes: a first triboelectric layer 113' provided on the first electrode 112; and a second triboelectric layer 123' provided on the second electrode 122. The first triboelectric layer 113' may include a first dielectric or a metal, and the second triboelectric layer 123' may include a second dielectric that is different from the first dielectric. The first triboelectric layer 113' and the second triboelectric layer 123' are spaced apart from each other by a predetermined distance after being charged by direct contact caused by an external pressure. Due to the mechanical force caused by the movement of the mass M, the first and second triboelectric layers 113' and 123' may rub against each other or the distance therebetween may be changed. In this case, a charge density difference may occur between the first and second triboelectric layers 113' and 123', thereby generating electric energy. A distance between the first and second triboelectric layers 113' and 123' may be, for example, about 0 mm to about 10 mm and may be about 0 mm to about 1 mm. However, exemplary embodiments are not limited thereto. The energy harvester 100a may further include at least one spacer 170 (see FIG. 1) provided between the first and second substrates 110 and 120. For example, the spacer 170 may include an elastic material, such as a spring or rubber, or a magnetic material, such as a magnet. However, this exemplary embodiment is not limited thereto. The energy harvester 100a may have a single-layer structure including one triboelectric generator, or may have a multi-layer structure including a stack of a plurality of triboelectric generators.

Figure 4:
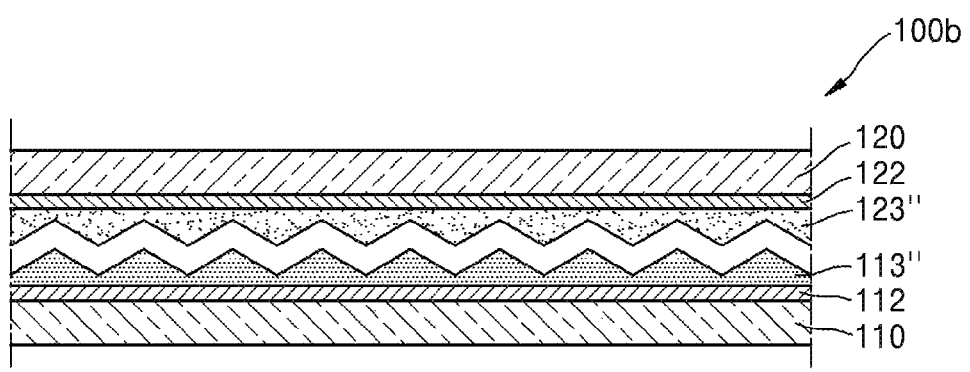
FIG. 4 is a cross-sectional view of an energy harvester according to another exemplary embodiment.

FIG. 4 is a cross-sectional view of an energy harvester 100b according to another exemplary embodiment. Only differences from the above-described embodiment will be mainly described hereinafter.

Referring to FIG. 4, the energy harvester 100b includes: first and second substrates 110 and 120 spaced apart from each other; first and second electrodes 112 and 122 provided on the first and second substrates 110 and 120; and an energy generator provided between the first and second electrodes 112 and 122. At least one of the first and second substrates 110 and 120 may be connected to the mass M. Since the first and second substrates 110 and 120 and the first and second electrodes 112 and 122 have been described above, a description thereof will be omitted here.

The energy generator is provided between the first and second electrodes 112 and 122. The energy generator may be a triboelectric generator. The triboelectric generator includes: a first triboelectric layer 113" provided on the first electrode 112; and a second triboelectric layer 123" provided on the second electrode 122. The first triboelectric layer 113" may include a first dielectric or a metal, and the second triboelectric layer 123" may include a second dielectric that is different from the first dielectric. Due to the mechanical force caused by the movement of the mass M, the first and second triboelectric layers 113" and 123" may rub against each other or the distance therebetween may be changed. In this case, a charge density difference may occur between the first and second triboelectric layers 113" and 123", thereby generating electric energy. A distance between the first and second triboelectric layers 113" and 123" may be, for example, about 0 mm to about 10 mm and may be about 0 mm to about 1 mm. However, exemplary embodiments are not limited thereto.

The surfaces of the first and second triboelectric layers 113" and 123" may be rough. In detail, a plurality of first protrusions may be formed on the surface of the first triboelectric layer 113", and a plurality of second protrusions may be formed on the surface of the second triboelectric layer 123". The first and second protrusions are spaced apart from each other, and the first and second protrusions may be disposed alternately with each other. The first and second protrusions may have, for example, a nano-surface structure such as a nano-pyramid shape or a micro-surface structure such as a micro-pyramid shape, but are not limited thereto. The first and second protrusions each may have a size of about 1 nm to about 1 mm. The first and second protrusions may be formed by photolithographic patterning, plasma etching, 3D printing, thin film transfer, coating, nano-imprinting, or direct growth. When the first and second protrusions are alternately formed on the surfaces of the first and second triboelectric layers 113" and 123", the energy harvester 100b may react to a minute movement of the mass M in any of various directions, and the area of a dielectric interface, at which friction is generated, may be increased, thus making it possible to generate electric energy more efficiently. The energy harvester 100b may further include at least one spacer 170 (see FIG. 1) provided between the first and second substrates 110 and 120. For example, the spacer 170 may include an elastic material, such as a spring or rubber, or a magnetic material, such as a magnet. However, this exemplary embodiment is not limited thereto. The energy harvester 100b may have a single-layer structure including one triboelectric generator, or may have a multi-layer structure including a stack of a plurality of triboelectric generators.

Figure 20:
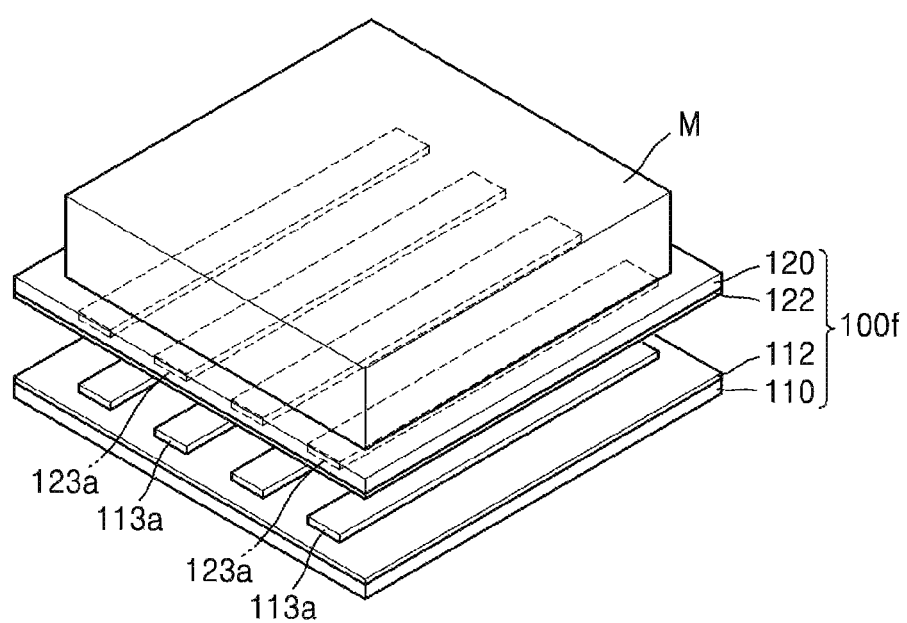
FIG. 20 is a perspective view of an energy harvester according to another exemplary embodiment.

FIG. 20 is a cross-sectional view of an energy harvester 100f according to another exemplary embodiment.

Referring to FIG. 20, the energy harvester 100f includes: first and second substrates 110 and 120 spaced apart from each other; first and second electrodes 112 and 122 provided on the first and second substrates 110 and 120; and an energy generator provided between the first and second electrodes 112 and 122. Any one of the first and second substrates 110 and 120 may be connected to the mass M. Since the first and second substrates 110 and 120 and the first and second electrodes 112 and 122 have been described above, a description thereof will be omitted here.

The energy generator is provided between the first and second electrodes 112 and 122. The energy generator may be a triboelectric generator. The triboelectric generator includes: a first triboelectric layer 113a provided on the first electrode 112; and a second triboelectric layer 123a provided on the second electrode 122. The first triboelectric layer 113a may include a first dielectric or a metal, and the second triboelectric layer 123a may include a second dielectric that is different from the first dielectric. Due to the mechanical force caused by the movement of the mass M, the first and second triboelectric layers 113a and 123a may rub against each other or the distance therebetween may be changed. In this case, a charge density difference may occur between the first and second triboelectric layers 113a and 123a, thereby generating electric energy. A distance between the first and second triboelectric layers 113a and 123a may be, for example, about 0 mm to about 10 mm and may be about 0 mm to about 1 mm. However, exemplary embodiments are not limited thereto.

The first and second triboelectric layers 113a and 123a have a line array shape. In detail, the first triboelectric layer 113a has a structure in which first lines are arranged on the top surface of the first electrode 112 in parallel to each other, and the second triboelectric layer 123a has a structure in which second lines are arranged on the bottom surface of the second electrode 122 in parallel to each other. In the energy harvester 100f, when the mass M moves in a direction perpendicular to the direction of the first and second lines, electric energy may be obtained more efficiently.

Figure 21:
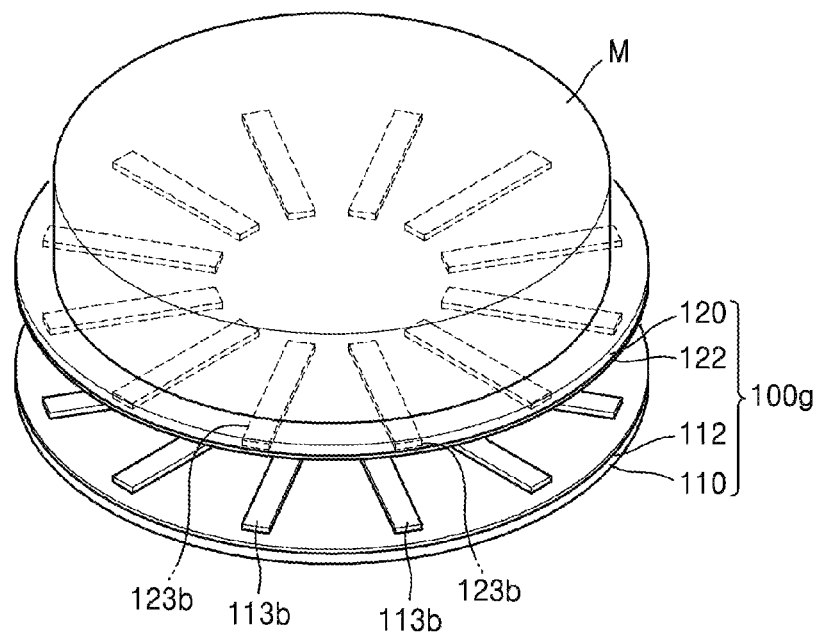
FIG. 21 is a perspective view of an energy harvester according to another exemplary embodiment.
Figure 22:
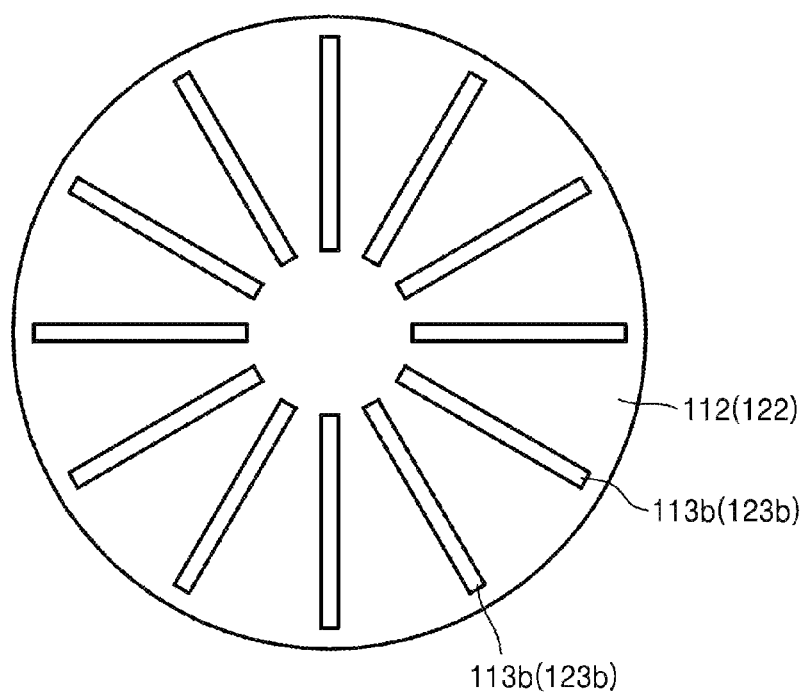
FIG. 22 is a top view of a first substrate or a bottom view of a second substrate in the energy harvester illustrated in FIG. 21.

FIG. 21 is a perspective view of an energy harvester 100g according to another exemplary embodiment. FIG. 22 is a top view of the first substrate 110 (or a bottom view of the second substrate 120) in the energy harvester illustrated in FIG. 21.

Referring to FIGS. 21 and 22, the energy harvester 100g includes: first and second substrates 110 and 120 spaced apart from each other; first and second electrodes 112 and 122 provided on the first and second substrates 110 and 120; and an energy generator provided between the first and second electrodes 112 and 122. Any one of the first and second substrates 110 and 120 may be connected to the mass M. Since the first and second substrates 110 and 120 and the first and second electrodes 112 and 122 have been described above, a description thereof will be omitted here.

The energy generator is provided between the first and second electrodes 112 and 122. The energy generator may be a triboelectric generator. The triboelectric generator includes: a first triboelectric layer 113b provided on the first electrode 112; and a second triboelectric layer 123b provided on the second electrode 122. The first triboelectric layer 113b may include a first dielectric or a metal, and the second triboelectric layer 123b may include a second dielectric that is different from the first dielectric. Due to the mechanical force caused by the movement of the mass M, the first and second triboelectric layers 113b and 123b may rub against each other or the distance therebetween may be changed. In this case, a charge density difference may occur between the first and second triboelectric layers 113b and 123b, thereby generating electric energy. A distance between the first and second triboelectric layers 113b and 123b may be, for example, about 0 mm to about 10 mm and may be about 0 mm to about 1 mm. However, exemplary embodiments are not limited thereto.

The first and second triboelectric layers 113b and 123b have a line array shape. In detail, the first triboelectric layer 113b has a structure in which first lines are arranged radially on the top surface of the first electrode 112, and the second triboelectric layer 123b has a structure in which second lines are arranged radially on the bottom surface of the second electrode 122. In the energy harvester 100g, when the mass M rotates in a direction perpendicular to the direction of the first and second lines, electric energy may be obtained more efficiently.

Figure 5:
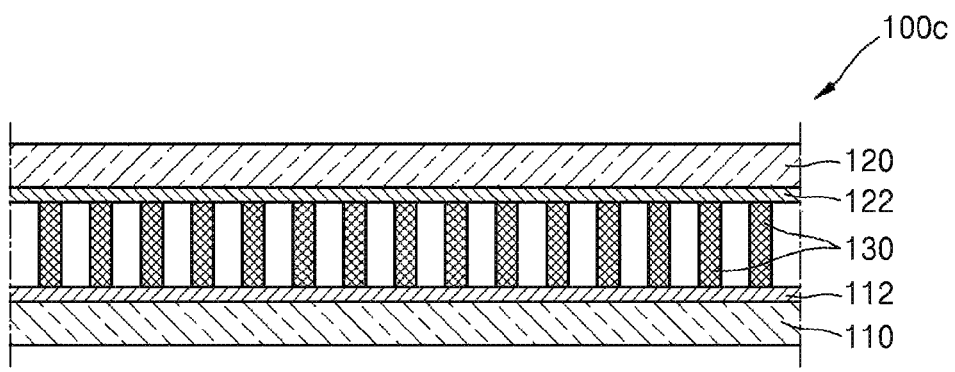
FIG. 5 is a cross-sectional view of an energy harvester according to another exemplary embodiment.

FIG. 5 is a cross-sectional view of an energy harvester 100c according to another exemplary embodiment. Only differences from the above-described embodiment will be mainly described hereinafter.

Referring to FIG. 5, the energy harvester 100c includes: first and second substrates 110 and 120 spaced apart from each other; first and second electrodes 112 and 122 provided on the first and second substrates 110 and 120; and an energy generator provided between the first and second electrodes 112 and 122. At least one of the first and second substrates 110 and 120 may be connected to the mass M. Since the first and second substrates 110 and 120 and the first and second electrodes 112 and 122 have been described above, a description thereof will be omitted here.

The energy generator is provided between the first and second electrodes 112 and 122. The energy generator may be a piezoelectric generator that generates electric energy by being deformed by the movement of the mass M. The piezoelectric generator includes a plurality of piezoelectric nanowires 130. The piezoelectric nanowires 130 may be arranged vertically or may be inclined at an acute angle with respect to the first electrode 112. Although not illustrated in FIG. 5, an insulating layer having a high dielectric constant may be further provided on the top surface of the first electrode 112, in order to uniformly grow the piezoelectric nanowires 130. The piezoelectric nanowires 130 may include, for example, ZnO, SnO, PZT, $ZnSnO_3$, polyvinylidene fluoride (PVDF), or P(VDF-TrFE), but are not limited thereto. The energy harvester 100c may further include at least one spacer 170 (see FIG. 1) provided between the first and second substrates 110 and 120. For example, the spacer 170 may include an elastic material, such as a spring or rubber, or a magnetic material, such as a magnet. However, this exemplary embodiment is not limited thereto.

In the above mobile device, when the mobile device body that is the mass M is moved horizontally or vertically, a mechanical force caused by the movement of the mass M is applied to the energy harvester 100c. The mechanical force deforms the piezoelectric nanowires 130, and a piezoelectric potential results at both ends of the deformed piezoelectric nanowires 130, thereby generating electric energy. The generated electric energy may be supplied to the mobile device body that is the mass M, or may be stored in the battery. An exemplary case where the energy harvester 100c has a single-layer structure including one piezoelectric generator has been described above. However, the energy harvester 100c may also have a multi-layer structure including a stack of a plurality of piezoelectric generators.

Figure 6:
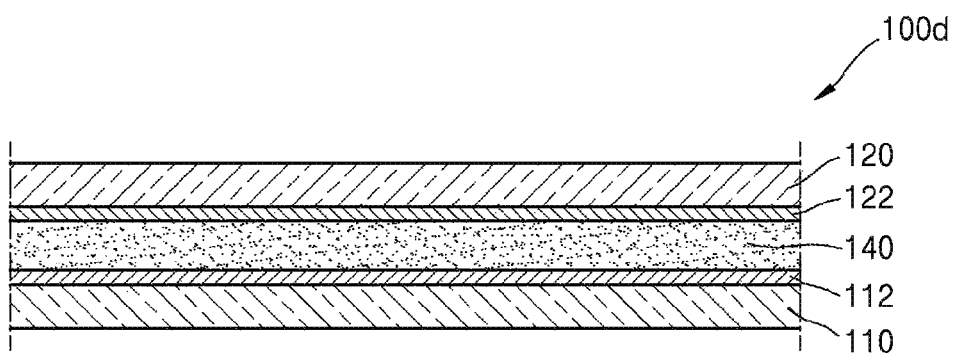
FIG. 6 is a cross-sectional view of an energy harvester according to another exemplary embodiment.

FIG. 6 is a cross-sectional view of an energy harvester 100d according to another exemplary embodiment. Only differences from the above-described embodiment will be mainly described hereinafter.

Referring to FIG. 6, the energy harvester 100d includes: first and second substrates 110 and 120 spaced apart from each other; first and second electrodes 112 and 122 provided on the first and second substrates 110 and 120; and an energy generator provided between the first and second electrodes 112 and 122. At least one of the first and second substrates 110 and 120 may be connected to the mass M. Since the first and second substrates 110 and 120 and the first and second electrodes 112 and 122 have been described above, a description thereof will be omitted here.

The energy generator is provided between the first and second electrodes 112 and 122. The energy generator may be a piezoelectric generator. The piezoelectric generator includes a piezoelectric thin-film layer 140. The piezoelectric thin-film layer 140 is deformed by a mechanical force applied by the movement of the mass M, thereby causing a piezoelectric potential to be generated between the top and bottom of the piezoelectric thin-film layer 140. The piezoelectric thin-film layer 140 may include an inorganic material or an organic material. The piezoelectric thin-film layer 140 may include, for example, ZnO, $ZnSnO_3$, SnO, $BaTiO_3$, $NaNbO_3$, PZT, PVDF, or P(VDF-TrFE), but is not limited thereto. The energy harvester 100d may further include at least one spacer 170 (see FIG. 1) provided between the first and second substrates 110 and 120. For example, the spacer 170 may include an elastic material, such as a spring or rubber, or a magnetic material, such as a magnet. However, this exemplary embodiment is not limited thereto. The energy harvester 100d may have a single-layer structure including one piezoelectric generator, or may have a multi-layer structure including a stack of a plurality of piezoelectric generators.

Figure 7:
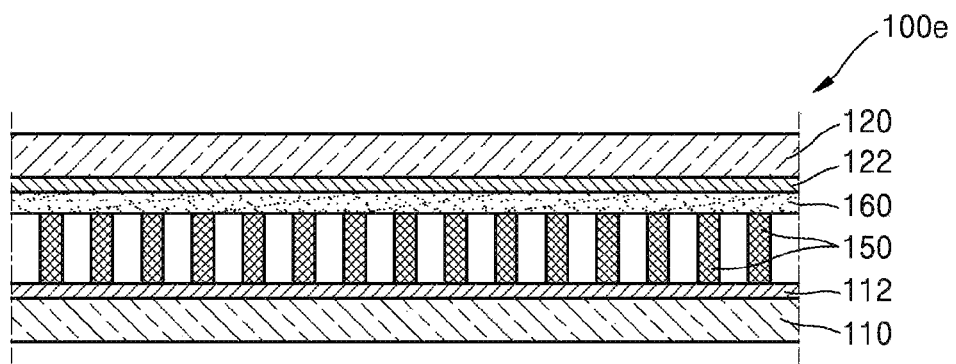
FIG. 7 is a cross-sectional view of an energy harvester according to another exemplary embodiment.

FIG. 7 is a cross-sectional view of an energy harvester 100e according to another exemplary embodiment. Only differences from the above-described embodiment will be mainly described hereinafter.

Referring to FIG. 7, the energy harvester 100e includes: first and second substrates 110 and 120 spaced apart from each other; first and second electrodes 112 and 122 provided on the first and second substrates 110 and 120; and an energy generator provided between the first and second electrodes 112 and 122. At least one of the first and second substrates 110 and 120 may be connected to the mass M. Since the first and second substrates 110 and 120 and the first and second electrodes 112 and 122 have been described above, a description thereof will be omitted here.

The energy generator is provided between the first and second electrodes 112 and 122. The energy generator may be a hybrid electric generator that includes a combination of a piezoelectric generator and a triboelectric generator. The hybrid electric generator includes: a plurality of piezoelectric nanowires 150 provided on the first electrode 112; and a dielectric film 160 provided on the second electrode 122.

The piezoelectric nanowires 150 may be arranged vertically or may be inclined at an angle on the first electrode 112. Although not illustrated in FIG. 7, an insulating layer having a high dielectric constant may be further provided on the top surface of the first electrode 112, in order to uniformly grow the piezoelectric nanowires 150. The piezoelectric nanowires 150 may include a material generating a piezoelectric potential at both ends thereof due to deformation, for example, ZnO, SnO, PZT, $ZnSnO_3$, PVDF, or P(VDF-TrFE), but are not limited thereto. The dielectric film 160 is provided between the piezoelectric nanowires 150 and the second electrode 122. The dielectric film 160 insulates between the first electrode 112 and the second electrode 122, and generates electric energy by a charge density difference caused by a change in the distance between the dielectric film 160 and the first electrode 112. The dielectric film 160 may include a ferroelectric material, a piezoelectric material, an electrostatic material, or a superconductive material. The dielectric film 160 may have a continuous-film structure, a porous structure, a nano-wire structure, or any combination thereof. The dielectric film 160 may be formed, for example, by deposition, coating, growth, or attachment. For example, the dielectric film 160 may include an inorganic material or a polymer-based organic material. For example, the dielectric film 160 may include silicon rubber, teflon, PDMS, PVD, kapton, polypropylene, polyethylene, PVC, polyformaldehyde, ethylcellulose, polyamide, wool, silk, or PVA. The energy harvester 100e may further include at least one spacer 170 (see FIG. 1) provided between the first and second substrates 110 and 120. For example, the spacer 170 may include an elastic material, such as a spring or rubber, or a magnetic material, such as a magnet. However, this exemplary embodiment is not limited thereto.

In the above structure, when a mechanical force caused by the movement of the mass M is applied to the energy harvester 100e, electric energy may be generated by piezoelectricity caused by the deformation of the piezoelectric nanowires 150, and electric energy may be generated by triboelectricity caused by a change in the distance between the dielectric film 160 and the first electrode 112. The energy harvester 100e may have a single-layer structure including one hybrid electric generator, or may have a multi-layer structure including a stack of a plurality of hybrid electric generators. It is also possible to implement an energy harvester that has a multi-layer structure including a stack of at least two of the piezoelectric generator, the triboelectric generator, and the hybrid electric generator.

Figure 8:
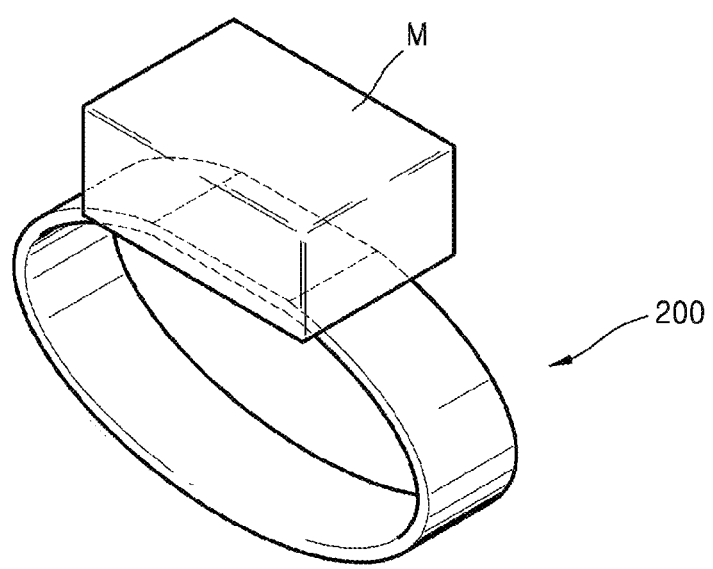
FIG. 8 is a perspective view of a mobile device including an energy harvester according to another exemplary embodiment.
Figure 9:
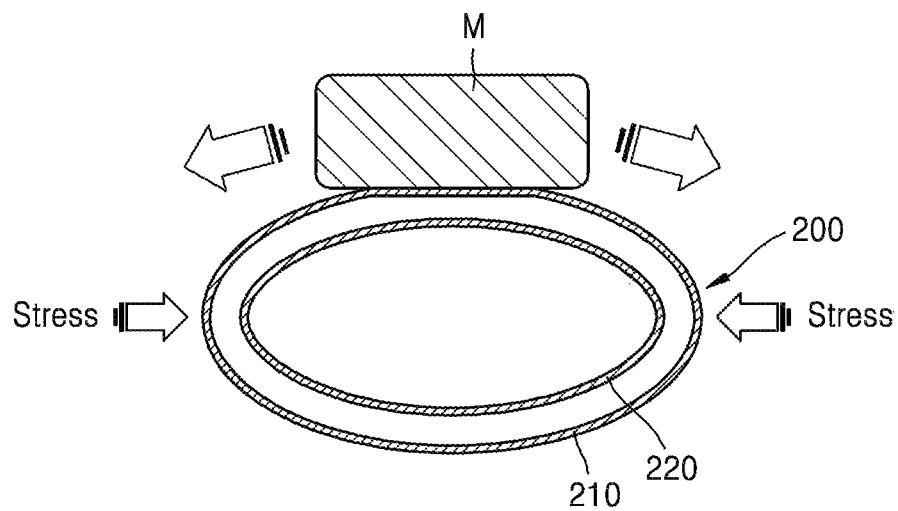
FIG. 9 is a cross-sectional view of the mobile device illustrated in FIG. 8.

FIG. 8 is a perspective view of a mobile device including an energy harvester according to another exemplary embodiment. FIG. 9 is a cross-sectional view of the mobile device illustrated in FIG. 8.

Referring to FIGS. 8 and 9, the mobile device includes a mass M and an energy harvester 200 configured to generate electric energy by the movement of the mass M. The mobile device may be, for example, a device attached to a human body. For example, the mobile device may include a smart watch, and may also include an MP3 player, a Bluetooth device, a mobile phone, a radio, a biosensor, a position sensor, a body temperature sensor, or a blood pressure sensor, which are attached to a human body. However, this exemplary embodiment is not limited thereto. The mass M is a mobile device body. The mass M is connected to the energy harvester 200 to apply a mechanical force to the energy harvester 200 by the movement thereof. The energy harvester 200 generates electric energy by using the mechanical force generated by the movement of the mass M.

The energy harvester 200 may have a band-type structure. In detail, the energy harvester 200 includes: first and second substrates 210 and 220 spaced apart from each other; first and second electrodes (not illustrated) provided on the first and second substrates 210 and 220; and an energy generator (not illustrated) provided between the first and second electrodes. One of the first and second substrates 210 and 220 may be connected to the mass M. FIG. 9 illustrates a case where the mass M is connected to the second substrate 220. In other examples, the mass M may be connected to the first substrate 210.

The first and second substrates 210 and 220 may have a band-type structure. For example, the first and second substrates 210 and 220 may include a flexible material such as plastic, textile, or metal foil. However, this exemplary embodiment is not limited thereto, and the first and second substrates 210 and 220 may include various other materials. The first and second electrodes are provided on the first and second substrates 210 and 220. For example, the first and second electrodes may include a flexible conductive material, such as graphene, CNT, ITO, metal, or conductive polymer. However, this exemplary embodiment is not limited thereto. The energy generator is provided between the first and second electrodes. The energy generator may be a piezoelectric generator, a triboelectric generator, or a hybrid electric generator that includes a combination of a piezoelectric generator and a triboelectric generator. Since the energy generator has been described in detail in the above-described embodiments, a description thereof will be omitted here.

In the above mobile device, when the mobile device body that is the mass M is moved horizontally or vertically by, for example, the movement of a human body, a mechanical force caused by the movement of the mass M is applied to the energy harvester 200. The energy harvester 200 may generate electric energy by using the applied mechanical force. For example, other external environments applicable to the mobile device may include mechanical vibration, wind, vibration of a rotating body, water flow, or electromagnetic vibration.

Figure 10:
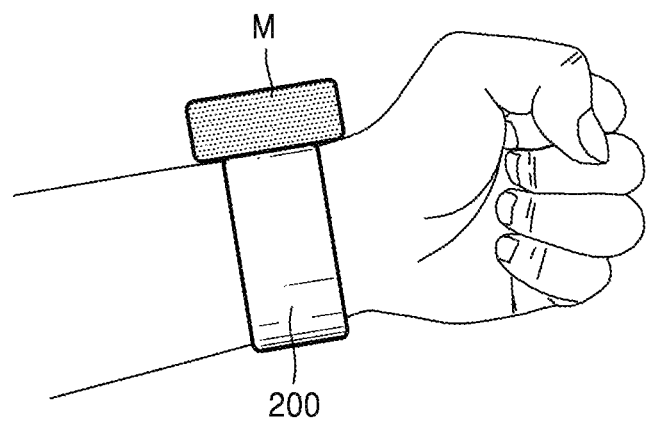
FIG. 10 is a view illustrating a state in which the mobile device illustrated in FIG. 8 is worn on a wrist.

FIG. 10 is a view illustrating a state in which the mobile device illustrated in FIG. 8 is worn on a wrist. A representative example of the mobile device illustrated in FIG. 10 may be a smart watch. In this case, the mass M may be a watch body, and the band-type energy harvester 100 may be a watchband that is worn on the wrist. In the state illustrated in FIG. 10, when the wrist is moved, the mass M is moved and a mechanical force caused by the movement of the mass M is applied to the energy harvester 100. The energy harvester 100 may generate electric energy by using the mechanical force of the mass M. The generated electric energy may be supplied to the watch body, or may be stored in a battery. In addition to the smart watch, the mobile device may include an MP3 player, a Bluetooth device, a mobile phone, a radio, a biosensor, a position sensor, a body temperature sensor, or a blood pressure sensor, which are attached to a human body.

Figure 11:
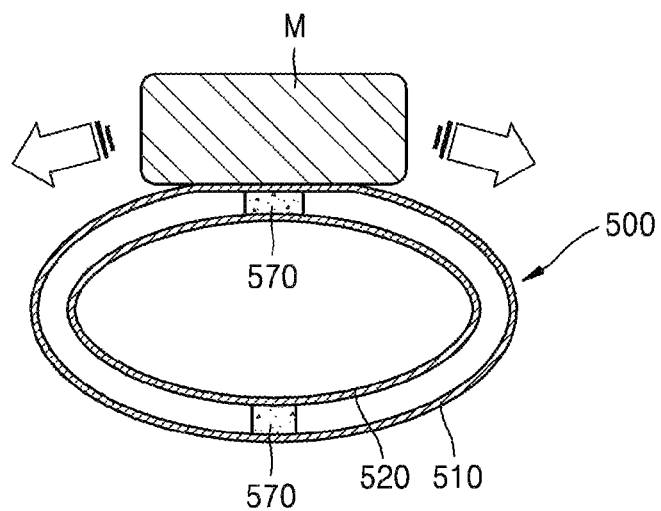
FIG. 11 is a cross-sectional view of a mobile device including an energy harvester according to another exemplary embodiment.

FIG. 11 is a cross-sectional view of a mobile device including an energy harvester 500 according to another exemplary embodiment.

Referring to FIG. 11, the mobile device includes a mass M and an energy harvester 500 configured to generate electric energy by the movement of the mass M. The energy harvester 500 generates electric energy by using a mechanical force generated by the movement of the mass M.

The energy harvester 500 may have a band-type structure. In detail, the energy harvester 500 includes: first and second substrates 510 and 520 spaced apart from each other; first and second electrodes (not illustrated) provided on the first and second substrates 510 and 520; an energy generator (not illustrated) provided between the first and second electrodes; and at least one spacer 570 provided on the first and second substrates 510 and 520. At least one of the first and second substrates 510 and 520 may be connected to the mass M. Since the first and second substrates 510 and 520 and the first and second electrodes have been described above, a description thereof will be omitted here. The energy generator may be a piezoelectric generator, a triboelectric generator, or a hybrid electric generator that includes a combination of a piezoelectric generator and a triboelectric generator. Since the energy generator has been described in detail in the above-described embodiments, a description thereof will be omitted here.

The spacer 570 is provided between the first and second substrates 510 and 520 to maintain a constant distance between the first and second substrates 510 and 520. The spacer 570 may include, for example, an elastic material, such as a spring or rubber, or a magnetic material, such as a magnet, but is not limited thereto. When the spacer 570 is disposed between the first and second substrates 510 and 520, the mechanical force caused by the movement of the mass M may be more effectively transmitted to the energy harvester 500 to generate electric energy.

Figure 12:
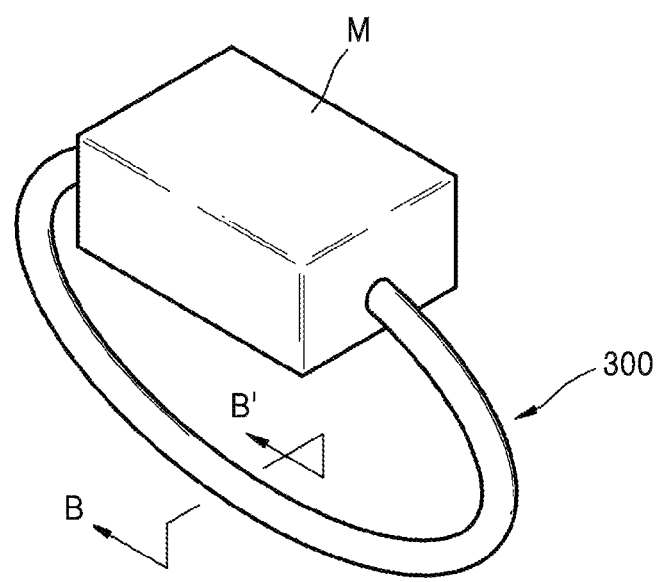
FIG. 12 is a perspective view of a mobile device including an energy harvester according to another exemplary embodiment.
Figure 13:
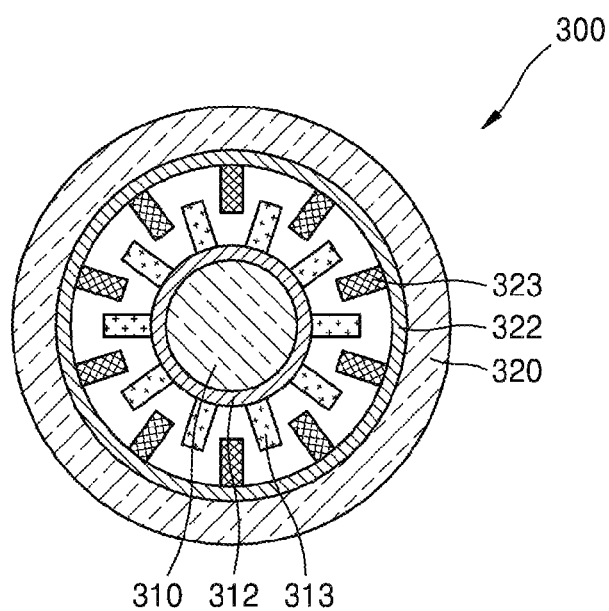
FIG. 13 is a cross-sectional view of the energy harvester illustrated in FIG. 12, which is taken along a line B-B' of FIG. 12.

FIG. 12 is a perspective view of a mobile device including an energy harvester 300 according to another exemplary embodiment. FIG. 13 is a cross-sectional view of the energy harvester 300 illustrated in FIG. 12, which is taken along a line B-B' of FIG. 12.

Referring to FIGS. 12 and 13, the mobile device includes a mass M and an energy harvester 300 configured to generate electric energy by the movement of the mass M. The mobile device may be, for example, a device attached to a human body, but is not limited thereto. The mass M is a mobile device body. The mass M is connected to the energy harvester 300 to apply a mechanical force to the energy harvester 300 by the movement thereof. The energy harvester 300 generates electric energy by using the mechanical force generated by the movement of the mass M.

The energy harvester 300 may have a core-shell structure. In detail, the energy harvester 300 includes: first and second substrates 310 and 320 spaced apart from each other; first and second electrodes 312 and 322 provided on the first and second substrates 310 and 320; and an energy generator provided between the first and second electrodes 312 and 322. At least one of the first and second substrates 310 and 320 may be connected to the mass M.

The first and second substrates 310 and 320 may have a core-shell structure. The first substrate 310 may be a wire-shaped core. Although not illustrated in FIGS. 12 and 13, the first substrate 310 may be a tube-shaped core. The second substrate 320 may be a tube-shaped shell that surrounds the first substrate 310. The first and second substrates 310 and 320 may include a flexible material. The first and second substrates 310 and 320 may include, for example, plastic, textile, fiber, or metal, but they are not limited thereto.

The first electrode 312 is provided on the outer surface of the first substrate 310, and the second electrode 322 is provided on the inner surface of the second substrate 320. The first and second electrodes 312 and 322 may include a flexible conductive material. For example, the first and second electrodes 312 and 322 may include graphene, CNT, ITO, metal, or conductive polymer. However, this exemplary embodiment is not limited thereto. The metal may include, for example, Ag, Al, Cu, or Au, and may also include other materials.

The energy generator is provided between the first and second electrodes 312 and 322. The energy generator may be a triboelectric generator. The triboelectric generator includes: a first triboelectric layer 313 provided on the first electrode 312; and a second triboelectric layer 323 provided on the second electrode 322. The first triboelectric layer 313 may include a first dielectric or a metal, and the second triboelectric layer 323 may include a second dielectric that is different from the first dielectric. The first triboelectric layer 313 may include a material that tends to be positively charged, such as, for example, polyformaldehyde, ethylcellulose, polyamide, wool, silk, Al, paper, cotton, steel, wood, Ni, Cu, Ag, or PVA. The second triboelectric layer 123 may include a material that tends to be negatively charged, such as silicon rubber, teflon, PDMS, kapton, PP, PE, or PVC. Also, the second triboelectric layer 123 may include piezoelectric materials such as ferroelectrics or electrets. The electrets may include, for example, flouropolymers, PVF, PVDF, PCTFE, PFA, FEP, ETFE, PET, or quartz. However, this exemplary embodiment is not limited thereto. For example, the first triboelectric layer 313 may include a material that tends to be negatively charged, and the second triboelectric layer 323 may include a material that tends to be positively charged. The first and second triboelectric layers 313 and 323 may include different materials that have a large difference in their degree of charging. The first triboelectric layer 313 and the second triboelectric layer 323 are spaced apart from each other by a predetermined distance after being charged by direct contact caused by an external pressure. Due to the mechanical force caused by the movement of the mass M, the first and second triboelectric layers 313 and 323 may rub against each other or the distance therebetween may be changed. In this case, a charge density difference may occur between the first and second triboelectric layers 313 and 323, thereby generating electric energy. A distance between the first and second triboelectric layers 313 and 323 may be, for example, about 0 mm to about 10 mm and may be about 0 mm to about 1 mm. However, exemplary embodiments are not limited thereto.

The first triboelectric layer 313 may include a plurality of first wires provided on the outer surface of the first electrode 312, and the second triboelectric layer 323 may include a plurality of second wires provided on the inner surface of the second electrode 322. The second wires are spaced apart from the first wires, and the first and second wires may be disposed alternately with each other. The first and second wires may have, for example, a nano-wire shape or a micro-wire shape, but are not limited thereto. The first and second wires each may have a diameter of about 1 nm to about 1 mm. The first and second wires may be formed by photolithographic patterning, plasma etching, 3D printing, thin film transfer, coating, nano-imprinting, or direct growth. When the first and second triboelectric layers 313 and 323 include the first and second wires disposed alternately with each other, the energy harvester 300 may react to a minute external force, and the area of a dielectric interface, at which friction is generated, may be increased, thus making it possible to generate electric energy more efficiently. Although not illustrated in FIGS. 12 and 13, at least one spacer may be provided between the first and second substrates 310 and 320. The spacer functions to maintain a constant distance between the first substrate 310 and the second substrate 320. For example, the spacer may include an elastic material, such as a spring or rubber, or a magnetic material, such as a magnet. When at least one spacer is disposed between the first and second substrates 310 and 320, the mechanical force caused by the movement of the mass M may be more effectively transmitted to the energy harvester 300 to generate electric energy.

In the above mobile device, when the mobile device body that is the mass M is moved horizontally or vertically, a mechanical force caused by the movement of the mass M is applied to the energy harvester 300. Due to the mechanical force, the first and second triboelectric layers 313 and 323 may rub against each other or the distance therebetween may be changed. Accordingly, a charge density difference may occur between the first and second triboelectric layers 313 and 323, thereby generating electric energy. When the first and second triboelectric layers 313 and 323 include the first and second wires disposed alternately with each other, the energy harvester 300 may react to a minute movement of the mass M in various directions, and the area of a dielectric interface, at which friction is generated, may be increased, thus making it possible to generate electric energy more efficiently. The generated electric energy may be supplied to the mobile device body that is the mass M, or may be stored in a battery. An exemplary case where the energy harvester 300 has a single-layer structure including one triboelectric generator has been described above. However, the energy harvester 300 may also have a multi-layer structure including a stack of a plurality of triboelectric generators.

Figure 14:
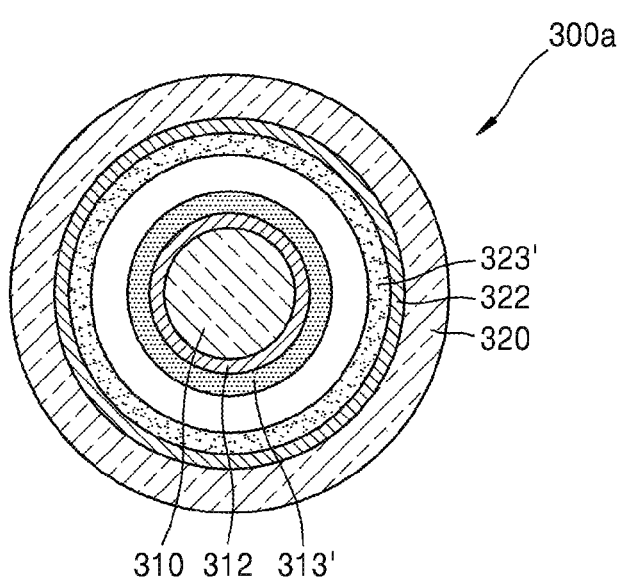
FIG. 14 is a cross-sectional view of an energy harvester according to another exemplary embodiment.

FIG. 14 is a cross-sectional view of an energy harvester 300a according to another exemplary embodiment. FIG. 14 is an enlarged view of a cross-section of an energy harvester 300a as a modification of the energy harvester 300 illustrated in FIGS. 12 and 13, and the same is true of the following drawings. Only differences from the above embodiment will be mainly described hereinafter.

Referring to FIG. 14, the energy harvester 300a includes: first and second substrates 310 and 320 spaced apart from each other; first and second electrodes 312 and 322 provided on the first and second substrates 310 and 320; and an energy generator provided between the first and second electrodes 312 and 322. The first and second substrates 310 and 320 may have a core-shell structure. The first substrate 310 may be a wire-shaped core or a tube-shaped core, and the second substrate 320 may be a tube-shaped shell that surrounds the first substrate 310. The first electrode 312 is provided on the outer surface of the first substrate 310, and the second electrode 322 is provided on the inner surface of the second substrate 320. Since the first and second substrates 310 and 320 and the first and second electrodes 312 and 322 have been described above, a detailed description thereof will be omitted here.

The energy generator is provided between the first and second electrodes 312 and 322. The energy generator may be a triboelectric generator. The triboelectric generator includes: a first triboelectric layer 312' provided on the first electrode 312; and a second triboelectric layer 323' provided on the second electrode 322. The first triboelectric layer 313' may include a first dielectric or a metal, and the second triboelectric layer 323' may include a second dielectric that is different from the first dielectric. The first triboelectric layer 313' and the second triboelectric layer 323' are spaced apart from each other by a predetermined distance after being charged by direct contact caused by an external pressure.

Due to the mechanical force caused by the movement of the mass M, the first and second triboelectric layers 313' and 323' may rub against each other or the distance therebetween may be changed. In this case, a charge density difference may occur between the first and second triboelectric layers 313' and 323', thereby generating electric energy. A distance between the first and second triboelectric layers 313' and 323' may be, for example, about 0 mm to about 10 mm and may be about 0 mm to about 1 mm. However, exemplary embodiments are not limited thereto. Although not illustrated in FIG. 14, at least one spacer may be further provided between the first and second substrates 310 and 320. The energy harvester 300a may have a single-layer structure including one triboelectric generator, or may have a multi-layer structure including a stack of a plurality of triboelectric generators.

Figure 15:
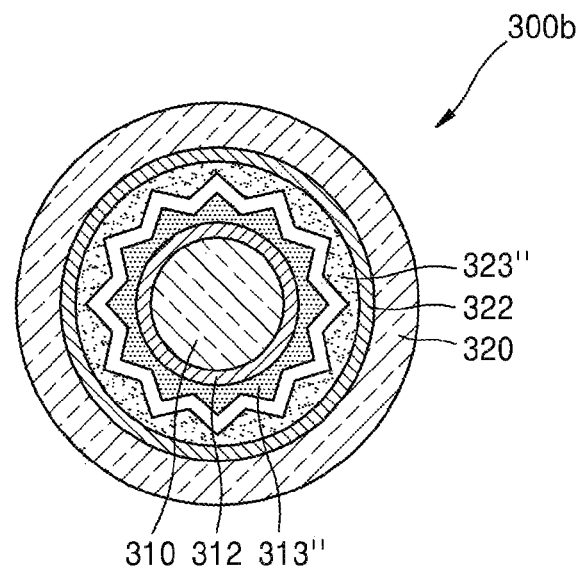
FIG. 15 is a cross-sectional view of an energy harvester according to another exemplary embodiment.

FIG. 15 is a cross-sectional view of an energy harvester 300b according to another exemplary embodiment. Only differences from the above-described embodiment will be mainly described hereinafter.

Referring to FIG. 15, the energy harvester 300b includes: first and second substrates 310 and 320 spaced apart from each other; first and second electrodes 312 and 322 provided on the first and second substrates 310 and 320; and an energy generator provided between the first and second electrodes 312 and 322. The first and second substrates 310 and 320 may have a core-shell structure. The first substrate 310 may be a wire-shaped core or a tube-shaped core, and the second substrate 320 may be a tube-shaped shell that surrounds the first substrate 310. The first electrode 312 is provided on the outer surface of the first substrate 310, and the second electrode 322 is provided on the inner surface of the second substrate 320. Since the first and second substrates 310 and 320 and the first and second electrodes 312 and 322 have been described above, a detailed description thereof will be omitted here.

The energy generator is provided between the first and second electrodes 312 and 322. The energy generator may be a triboelectric generator. The triboelectric generator includes: a first triboelectric layer 313" provided on the first electrode 312; and a second triboelectric layer 323" provided on the second electrode 322. The first triboelectric layer 313" may include a first dielectric or a metal, and the second triboelectric layer 323" may include a second dielectric that is different from the first dielectric. Due to the mechanical force caused by the movement of the mass M, the first and second triboelectric layers 313" and 323" may rub against each other or the distance therebetween may be changed. In this case, a charge density difference may occur between the first and second triboelectric layers 313" and 323", thereby generating electric energy. A distance between the first and second triboelectric layers 313" and 323" may be, for example, about 0 mm to about 10 mm and may be about 0 mm to about 1 mm. However, exemplary embodiments are not limited thereto.

The surfaces of the first and second triboelectric layers 313" and 323" may be rough. In detail, a plurality of first protrusions may be formed on the surface of the first triboelectric layer 313", and a plurality of second protrusions may be formed on the surface of the second triboelectric layer 323". The first and second protrusions are spaced apart from each other, and the first and second protrusions may be disposed alternately with each other. The first and second protrusions may have, for example, a nano-surface structure such as a nano-pyramid shape or a micro-surface structure such as a micro-pyramid shape, but are not limited thereto. The first and second protrusions each may have a size of about 1 nm to about 1 mm. The first and second protrusions may be formed by photolithographic patterning, plasma etching, 3D printing, thin film transfer, coating, nano-imprinting, or direct growth. When the first and second protrusions are alternately formed on the surfaces of the first and second triboelectric layers 313" and 323", the energy harvester 300b may react to a minute movement of the mass M in various directions, and the area of a dielectric interface, at which friction is generated, may be increased, thus making it possible to generate electric energy more efficiently. Although not illustrated in FIG. 15, at least one spacer may be further provided between the first and second substrates 310 and 320. The energy harvester 300b may have a single-layer structure including one triboelectric generator, or may have a multi-layer structure including a stack of a plurality of triboelectric generators.

Figure 16:
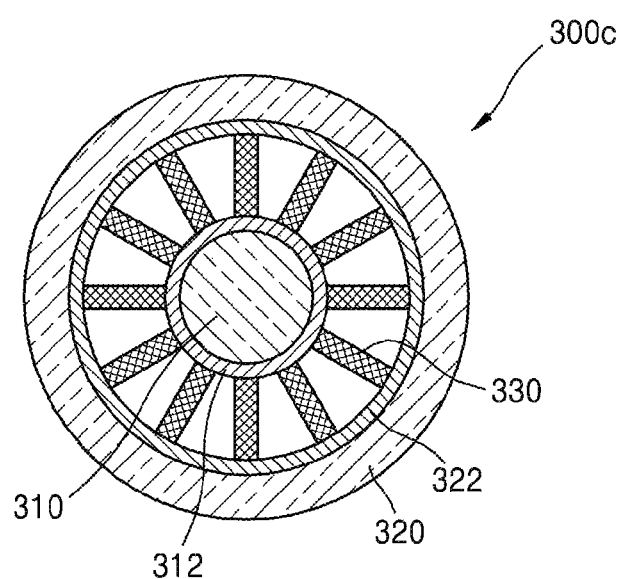
FIG. 16 is a cross-sectional view of an energy harvester according to another exemplary embodiment.

FIG. 16 is a cross-sectional view of an energy harvester 300c according to another exemplary embodiment. Only differences from the above-described embodiment will be mainly described hereinafter.

Referring to FIG. 16, the energy harvester 300c includes: first and second substrates 310 and 320 spaced apart from each other; first and second electrodes 312 and 322 provided on the first and second substrates 310 and 320; and an energy generator provided between the first and second electrodes 312 and 322. The first and second substrates 310 and 320 may have a core-shell structure. The first substrate 310 may be a wire-shaped core or a tube-shaped core, and the second substrate 320 may be a tube-shaped shell that surrounds the first substrate 310. The first electrode 312 is provided on the outer surface of the first substrate 310, and the second electrode 322 is provided on the inner surface of the second substrate 320. Since the first and second substrates 310 and 320 and the first and second electrodes 312 and 322 have been described above, a detailed description thereof will be omitted here.

The energy generator is provided between the first and second electrodes 312 and 322. The energy generator may be a piezoelectric generator. The piezoelectric generator includes a plurality of piezoelectric nanowires 330 provided between the first and second electrodes 312 and 322. The piezoelectric nanowires 330 may be arranged vertically or may be inclined at an angle on the outer surface of the first electrode 312. Although not illustrated in FIG. 16, an insulating layer having a high dielectric constant may be further provided on the top surface of the first electrode 312, in order to uniformly grow the piezoelectric nanowires 330. The piezoelectric nanowires 330 may include, for example, ZnO, SnO, PZT, ZnSnO$_3$, PVDF, or P(VDF-TrFE), but are not limited thereto. Although not illustrated in FIG. 16, at least one spacer may be further provided between the first and second substrates 310 and 320.

In the above-described structure, when the mobile device body that is the mass M is moved, a mechanical force caused by the movement of the mass M is applied to the energy harvester 300c. The mechanical force deforms the piezoelectric nanowires 330, and a piezoelectric potential results at both ends of the deformed piezoelectric nanowires 330, thereby generating electric energy. The generated electric energy may be supplied to the mobile device body that is the mass M, or may be stored in the battery. The energy harvester 300c may have a single-layer structure including one piezoelectric generator, or may have a multi-layer structure including a stack of a plurality of piezoelectric generators.

Figure 17:
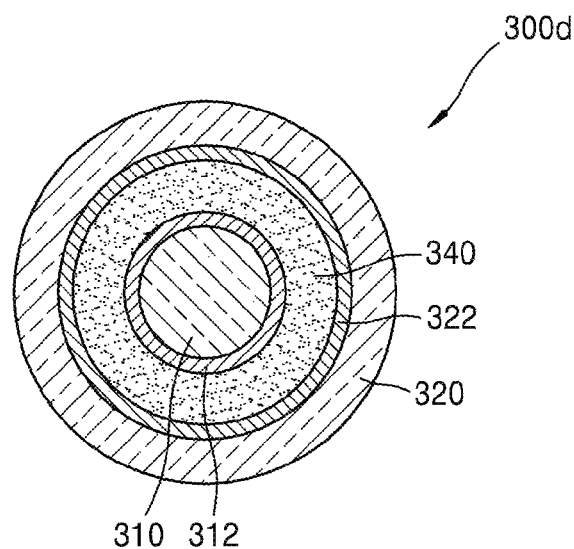
FIG. 17 is a cross-sectional view of an energy harvester according to another exemplary embodiment.

FIG. 17 is a cross-sectional view of an energy harvester 300d according to another exemplary embodiment. Only differences from the above-described embodiment will be mainly described hereinafter.

Referring to FIG. 17, the energy harvester 300d includes: first and second substrates 310 and 320 spaced apart from each other; first and second electrodes 312 and 322 provided on the first and second substrates 310 and 320; and an energy generator provided between the first and second electrodes 312 and 322. The first and second substrates 310 and 320 may have a core-shell structure. The first substrate 310 may be a wire-shaped core or a tube-shaped core. The second substrate 320 may be a tube-shaped shell that surrounds the first substrate 310. The first electrode 312 is provided on the outer surface of the first substrate 310, and the second electrode 322 is provided on the inner surface of the second substrate 320. Since the first and second substrates 310 and 320 and the first and second electrodes 312 and 322 have been described above, a detailed description thereof will be omitted here.

The energy generator is provided between the first and second electrodes 312 and 322. The energy generator may be a piezoelectric generator. The piezoelectric generator includes a piezoelectric thin-film layer 340. The piezoelectric thin-film layer 340 is deformed by a mechanical force generated by the movement of the mass M, thereby causing a piezoelectric potential to be generated between the top and bottom of the piezoelectric thin-film layer 340. The piezoelectric thin-film layer 340 may include an inorganic material or an organic material. The piezoelectric thin-film layer 340 may include, for example, ZnO, ZnSnO$_3$, SnO, BaTiO$_3$, NaNbO$_3$, PZT, PVDF, or P(VDF-TrFE), but is not limited thereto. Although not illustrated in FIG. 17, at least one spacer may be further provided between the first and second substrates 310 and 320. The energy harvester 300d may have a single-layer structure including one piezoelectric generator, or may have a multi-layer structure including a stack of a plurality of piezoelectric generators.

Figure 18:
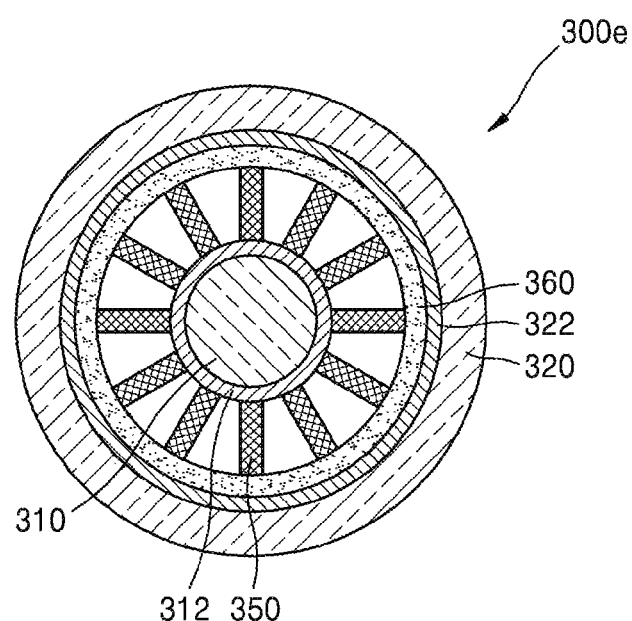
FIG. 18 is a cross-sectional view of an energy harvester according to another exemplary embodiment.

FIG. 18 is a cross-sectional view of an energy harvester 300e according to another exemplary embodiment. Only differences from the above embodiment will be mainly described hereinafter.

Referring to FIG. 18, the energy harvester 300e includes: first and second substrates 310 and 320 spaced apart from each other; first and second electrodes 312 and 322 provided on the first and second substrates 310 and 320; and an energy generator provided between the first and second electrodes 312 and 322. The first and second substrates 310 and 320 may have a core-shell structure. The first substrate 310 may be a wire-shaped core or a tube-shaped core. The second substrate 320 may be a tube-shaped shell that surrounds the first substrate 310. The first electrode 312 is provided on the outer surface of the first substrate 310, and the second electrode 322 is provided on the inner surface of the second substrate 320. Since the first and second substrates 310 and 320 and the first and second electrodes 312 and 322 have been described above, a detailed description thereof will be omitted here.

The energy generator is provided between the first and second electrodes 312 and 322. The energy generator may be a hybrid electric generator that includes a combination of a piezoelectric generator and a triboelectric generator. The hybrid electric generator includes: a plurality of piezoelectric nanowires 350 provided on the first electrode 312; and a dielectric film 360 provided on the second electrode 322.

The piezoelectric nanowires 350 may be arranged vertically or may be inclined at an angle on the first electrode 312. Although not illustrated in FIG. 18, an insulating layer having a high dielectric constant may be further provided on the top surface of the first electrode 312, in order to uniformly grow the piezoelectric nanowires 350. The piezoelectric nanowires 350 may include a material generating a piezoelectric potential at both ends thereof due to deformation, for example, ZnO, SnO, PZT, $ZnSnO_3$, PVDF, or P(VDF-TrFE), but are not limited thereto. The dielectric film 360 is provided between the piezoelectric nanowires 350 and the second electrode 322. The dielectric film 360 insulates between the first electrode 312 and the second electrode 322, and generates electric energy by a charge density difference caused by a change in the distance between the dielectric film 360 and the first electrode 312. The dielectric film 360 may include a ferroelectric material, a piezoelectric material, an electrostatic material, or a superconductive material. The dielectric film 360 may have a continuous-film structure, a porous structure, a nano-wire structure, or any combination thereof. The dielectric film 360 may be formed, for example, by deposition, coating, growth, or attachment. For example, the dielectric film 360 may include an inorganic material or a polymer-based organic material. For example, the dielectric film 360 may include silicon rubber, teflon, PDMS, PVD, kapton, polypropylene, polyethylene, PVC, polyformaldehyde, ethylcellulose, polyamide, wool, silk, or PVA. Although not illustrated in FIG. 18, at least one spacer may be further provided between the first and second substrates 310 and 320.

In the above-described structure, when a mechanical force caused by the movement of the mass M is applied to the energy harvester 300e, electric energy may be generated by piezoelectricity caused by the deformation of the piezoelectric nanowires 350, and electric energy may be generated by triboelectricity caused by a change in the distance between the dielectric film 360 and the first electrode 312. The energy harvester 300e may have a single-layer structure including one hybrid electric generator, or may have a multi-layer structure including a stack of a plurality of hybrid electric generators. It is also possible to implement an energy harvester that has a multi-layer structure including a stack of at least two of the piezoelectric generator, the triboelectric generator, and the hybrid electric generator.

Figure 19:
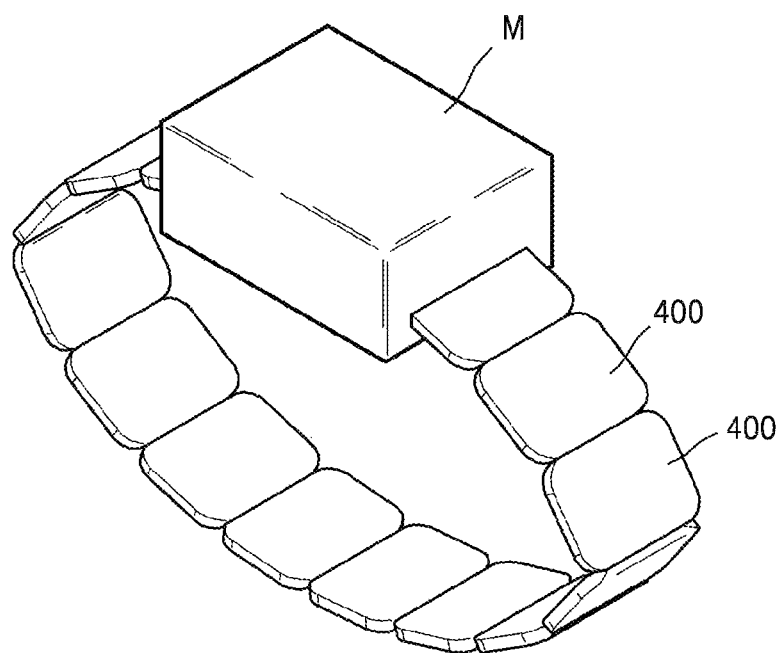
FIG. 19 is a perspective view of a mobile device including a plurality of energy harvesters according to another exemplary embodiment.

FIG. 19 is a perspective view of a mobile device including a plurality of energy harvesters 400 according to another exemplary embodiment.

Referring to FIG. 19, the mobile device includes a mass M and a plurality of energy harvesters 400 connected to each other to generate electric energy by the movement of the mass M. The mass M is a mobile device body. The mass M is connected to at least one of the energy harvesters 400 to apply a mechanical force to the energy harvesters 400 by the movement thereof. Each of the energy harvesters 400 generates electric energy by using a mechanical force generated by the movement of the mass M. The energy harvesters 400 may be connected to each other to have a band-type structure.

Each of the energy harvesters 300b may include at least one of a piezoelectric generator, a triboelectric generator, and a hybrid electric generator that includes a combination of a piezoelectric generator and a triboelectric generator. Since the energy harvester has been described in detail in the above-described embodiments, a description thereof will be omitted here.

In the above structure, when the mass M is moved by the movement of a human body, a mechanical force is applied to the energy harvesters 400 connected to the mass M, and the surrounding energy harvesters 400, and each of the energy harvesters 400 may generate electric energy by using the mechanical force. When the energy harvesters 400 are electrically connected in series to each other, more electric energy may be generated. The generated electric energy may be supplied to the mobile device body that is the mass M, or may be stored in the battery.

Figure 23:
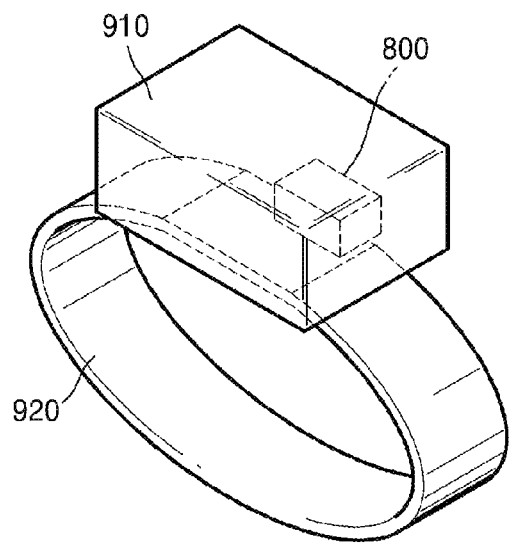
FIG. 23 is a perspective view of a mobile device according to another exemplary embodiment.
Figure 24:
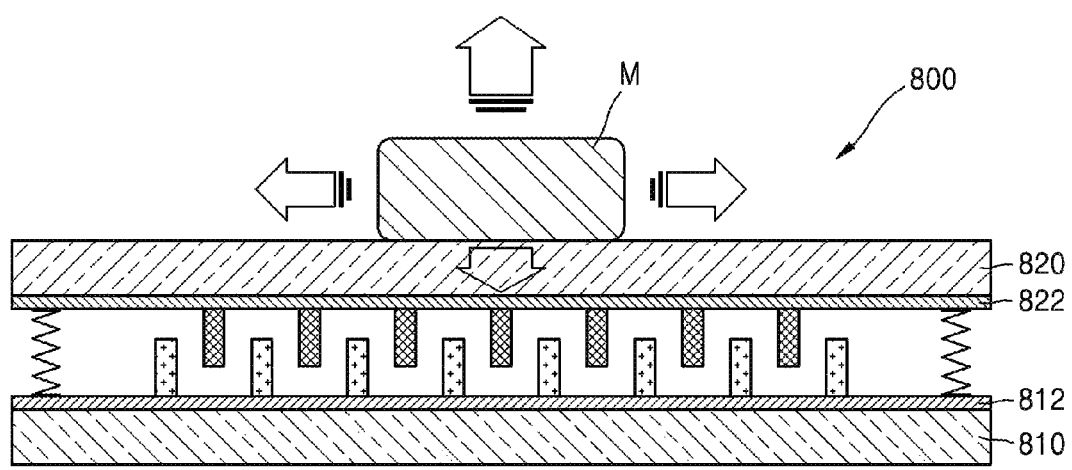
FIG. 24 is a cross-sectional view of an energy harvester provided in a mobile device body illustrated in FIG. 23.

FIG. 23 is a perspective view of a mobile device according to another exemplary embodiment. FIG. 24 is a cross-sectional view of an energy harvester 80 provided in a mobile device body 910 illustrated in FIG. 23.

Referring to FIGS. 23 and 24, the mobile device includes a mobile device body 910, a support 920 supporting the mobile device body 910, and an energy harvester 800 provided in the mobile device body 910. FIG. 23 illustrates a case where the support 920 has a band-type structure. However, exemplary embodiments are not limited thereto, and the support 920 may have a flat-plate structure or other structures.

The energy harvester 800 is provided in the mobile device body 910. Referring to FIG. 24, the energy harvester 800 includes: a mass M; first and second substrates 810 and 820 spaced apart from each other; first and second electrodes 812 and 822 provided on the first and second substrates 810 and 820; and an energy generator provided between the first and second electrodes 812 and 822. Any one of the first and second substrates 810 and 820 is connected to the mass M. FIG. 24 illustrates a case where the first and second substrates 810 and 820 have a flat-plate structure. However, exemplary embodiments are not limited thereto, and the first and second substrates 810 and 820 may have a band-type structure or a tube-type structure.

The energy generator generates electric energy by using a mechanical force generated by the movement of the mass M. The energy generator may be at least one of the triboelectric generator (see FIGS. 2 to 4, 13 to 15, 20, and 21), the piezoelectric generator (see FIGS. 5, 6, 16, and 17), and the hybrid generator (see FIGS. 7 and 18) that is a hybrid of the triboelectric generator and the piezoelectric generator. FIG. 24 illustrates a case in which a triboelectric generator is used as an energy generator.

When the mobile device is moved by the external environment (e.g., movement of a human body, mechanical vibration, wind, water flow, or electromagnetic vibration), the energy harvester 800 may generate electric energy by using a mechanical force applied by the movement of the mass M and/or the mobile device body 910. The generated electric energy may be supplied to the mobile device body 910, or may be stored in a battery. In the present embodiment, the energy harvester 800 is provided in the mobile device body 910. However, the energy harvester 800 may be provided in the support 920 or may be provided in the mobile device body 910 and the support 920 The energy harvester 800 may be provided on or in the mobile device body 910 or may be provided on or in the support 920.

Figure 25:
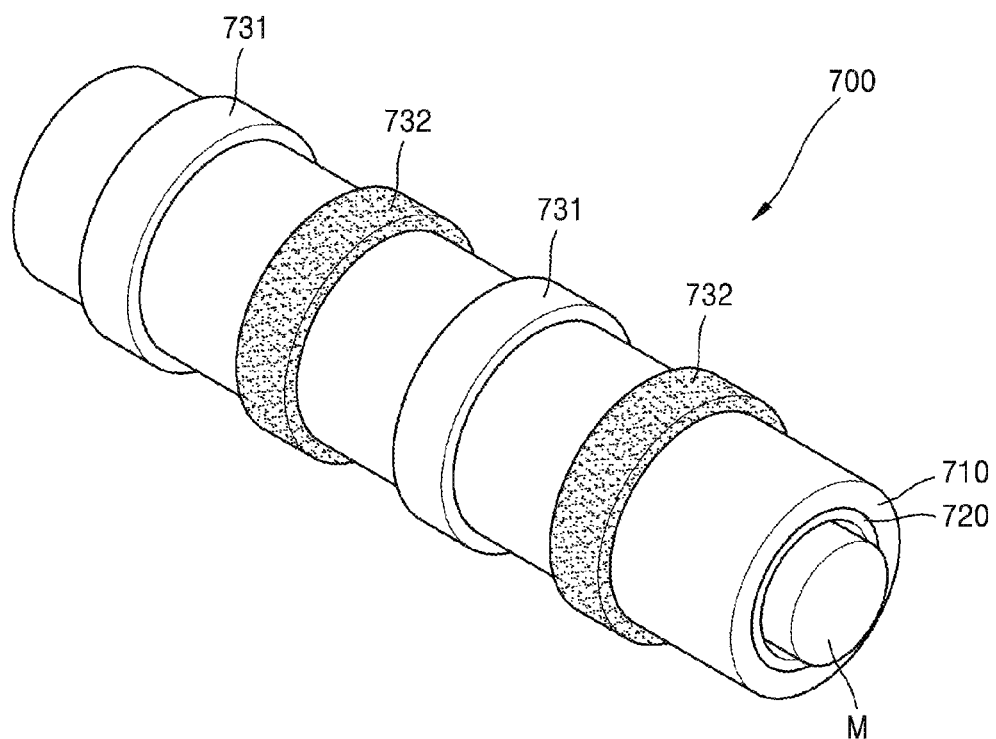
FIG. 25 is a perspective view of an energy harvester according to another exemplary embodiment.
Figure 26:
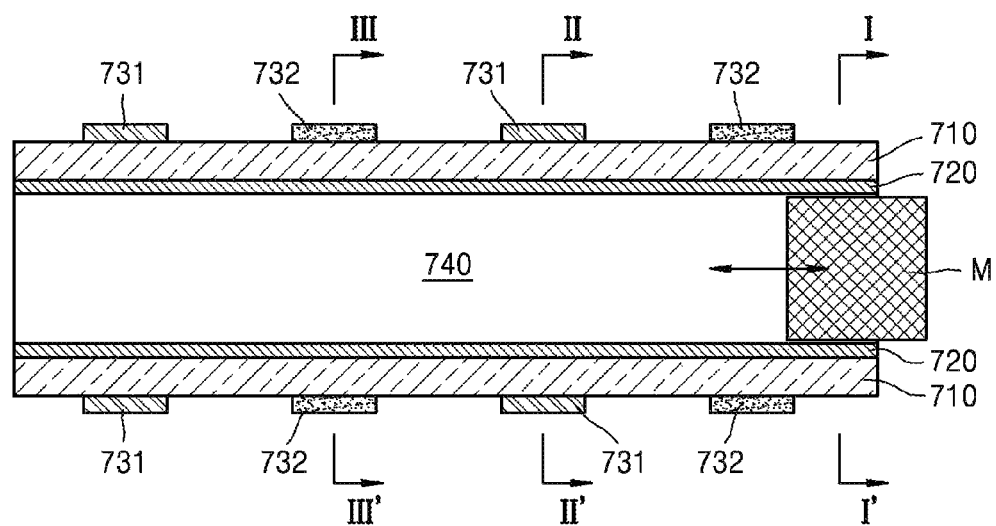
FIG. 26 is a cross-sectional view of the energy harvester illustrated in FIG. 25, which is taken along a longitudinal direction.
Figure 27A:
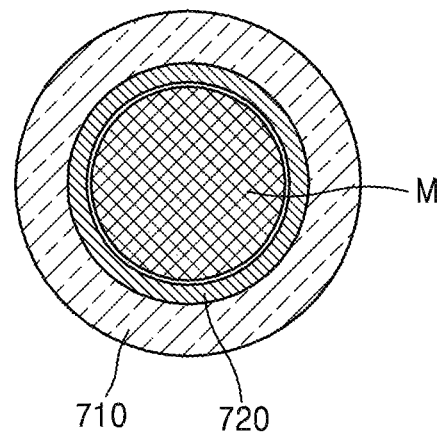
FIG. 27A is a cross-sectional view taken along a line I-I' of FIG. 26.
Figure 27B:
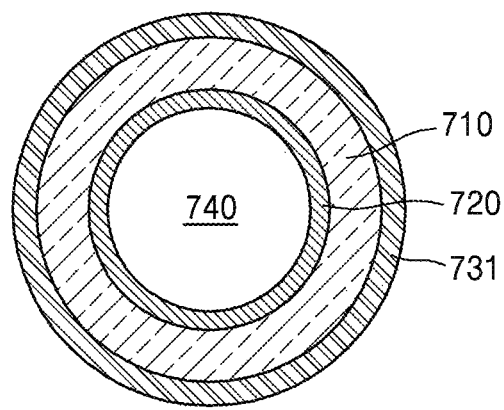
FIG. 27B is a cross-sectional view taken along a line II-II" of FIG. 26.
Figure 27C:
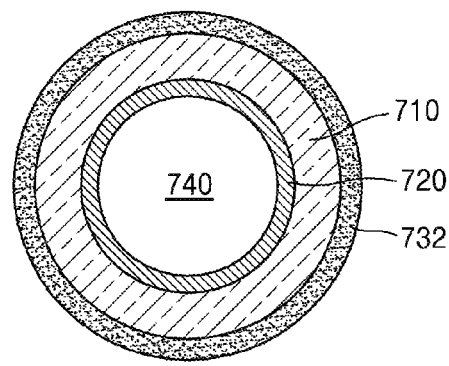
FIG. 27C is a cross-sectional view taken along a line III-III" of FIG. 26.

FIG. 25 is a perspective view of an energy harvester 700 according to another exemplary embodiment. FIG. 26 is a cross-sectional view of the energy harvester 700 illustrated in FIG. 25, which is taken along a longitudinal direction. FIG. 27A is a cross-sectional view taken along a line I-I' of FIG. 26, FIG. 27B is a cross-sectional view taken along a line II-II' of FIG. 26, and FIG. 27C is a cross-sectional view taken along a line III-III' of FIG. 26.

Referring to FIGS. 25 to 27C, the energy harvester 700 includes a substrate 710; at least one first electrode 731 and at least one second electrode 732 provided on an outer surface of the substrate 710; a triboelectric layer 720 provided on an inner surface of the substrate 710; and a mass M provided inside the triboelectric layer 720. The substrate 710 has a cylindrical shape, and a cavity 740 having a circular cross section is formed in the substrate 710. That is, the first substrate 710 has a circular tube shape. The substrate 710 may include, for example, a flexible material such as a plastic, but is not limited thereto. At least one first electrode 731 and at least one second electrode 732 are alternately provided on an outer surface of the circular tube-shaped substrate 710. The first and second electrodes 731 and 732 may surround the circular tube-shaped substrate 710. The first and second electrodes 731 and 732 may include, for example, graphene, carbon nanotubes (CNT), indium tin oxide (ITO), metal, or a conductive polymer. However, exemplary embodiments are not limited thereto. The metal may include, for example, Ag, Al, Cu, or Au, and may also include other materials.

An energy generator is provided in the circular tube-shaped substrate 710. The energy generator may be a triboelectric generator that generates electric energy when two different materials rub against each other or when a distance between two different materials changes. The triboelectric generator includes a triboelectric layer 720 provided on an inner surface of the circular tube-shaped substrate 710, and a mass M provided inside the triboelectric layer 720. The mass M is movable along a longitudinal direction within the cavity 740 that is formed inside the circular tube-shaped substrate 710. The mass M may have a circular pillar shape, a circular tube shape, or a ball shape to correspond to the cavity 740 having a circular cross section, but the shape of the mass M is not limited thereto.

The triboelectric layer 720 may include a first dielectric or a metal, and the mass M may include a second dielectric that is different from the first dielectric. The triboelectric layer 720 may include a material that tends to be positively charged, such as, for example, polyformaldehyde, ethylcellulose, polyamide, wool, silk, Al, paper, cotton, steel, wood, Ni, Cu, Ag, or PVA. The mass M may include a material that tends to be negatively charged, such as silicon rubber, teflon, PDMS, kapton, PP, PE, or PVC. Also, the mass M may include piezoelectric materials such as ferroelectrics or electrets. The electrets may include, for example, flouropolymers, PVF, PVDF, PCTFE, PFA, FEP, ETFE, PET, or quartz. However, exemplary embodiments are not limited thereto. For example, the triboelectric layer 720 may include a material that tends to be negatively charged, and the mass M may include a material that tends to be positively charged. Also, the triboelectric layer 720 and the mass M may include different materials that have a large difference in their degree of charging. A distance between the triboelectric layer 720 and the mass M may be, for example, about 0 mm to about 10 mm and may be about 0 mm to about 1 mm. However, exemplary embodiments are not limited thereto.

In the energy harvester 700, when the mass M moves along the cavity 740 inside the substrate 710 due to free fall or reaction, the mass M and the triboelectric layer 720 rub against each other or a distance between the mass M and the triboelectric layer 720 changes. In this case, a charge density difference may occur between the mass M and the triboelectric layer 720, so that electric energy may be generated between the first and second electrodes 731 and 732. In order to generate electric energy more efficiently, at least one of the surface of the mass M and the surface of the triboelectric layer 720 may have a micro-surface structure or a nano-surface structure created using a surface treatment. In order to control the vibration frequency, speed, and displacement of the mass M, the energy harvester 700 may further include, for example, an elastic member such as a spring. Although a case in which the first and second electrodes 731 and 732 are provided outside the substrate 710 have been described above, the first and second electrodes 731 and 732 may be provided inside the substrate 710. Also, two or more masses M may be provided inside the cavity 740 of the substrate 710.

Figure 28:
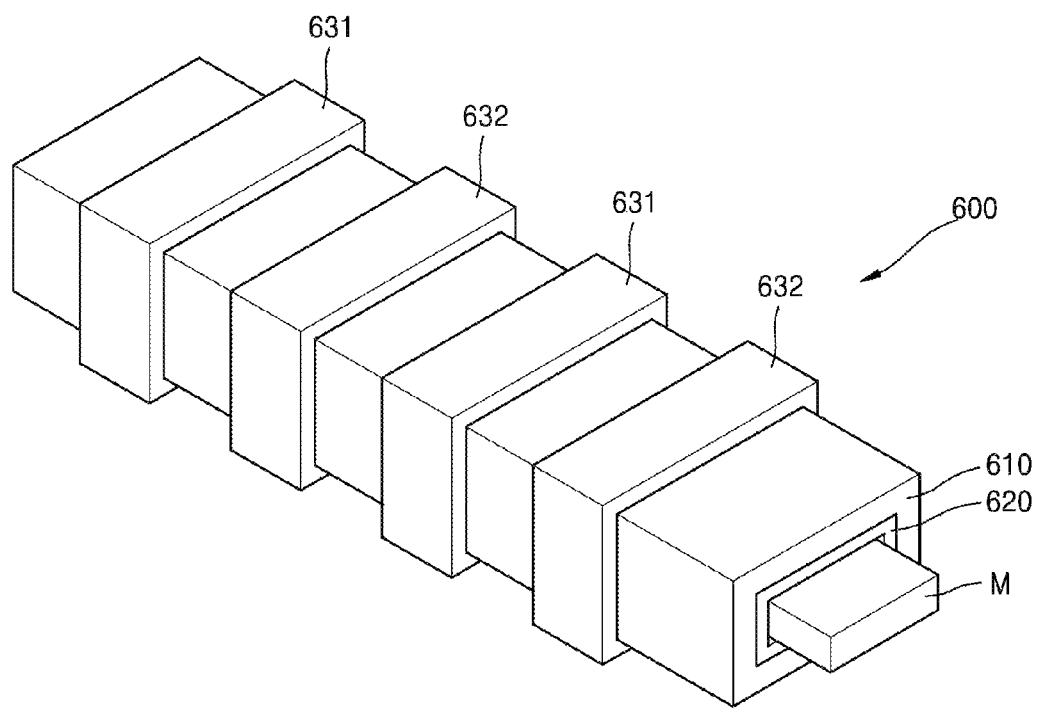
FIG. 28 is a perspective view of an energy harvester according to another exemplary embodiment.

FIG. 28 is a perspective view of an energy harvester 600 according to another exemplary embodiment. The energy harvester 600 illustrated in FIG. 28 is substantially identical to the energy harvester 700 illustrated in FIG. 25, with the exception that the substrate 610 has a square tube shape.

Referring to FIG. 28, the energy harvester 600 includes a substrate 610; at least one first electrode 631 and at least one second electrode 632 provided on an outer surface of the substrate 610; a triboelectric layer 620 provided on an inner surface of the substrate 610; and a mass M provided inside the triboelectric layer 620. The substrate 610 has a square tube shape (more specifically, a flat square tube shape), and thus, a cavity having a square cross section is formed in the substrate 610. At least one first electrode 631 and at least one second electrode 632 are provided alternately on an outer surface of the substrate 610. The mass M is provided to be movable along a longitudinal direction in the cavity that is formed inside the substrate 610. The mass M may have a square pillar shape or a square tube shape to correspond to the cavity having a square cross section, but the shape of the mass M is not limited thereto. The cross sections of the substrate 610 and the mass M may have other shapes other than the square shapes.

Figure 29:
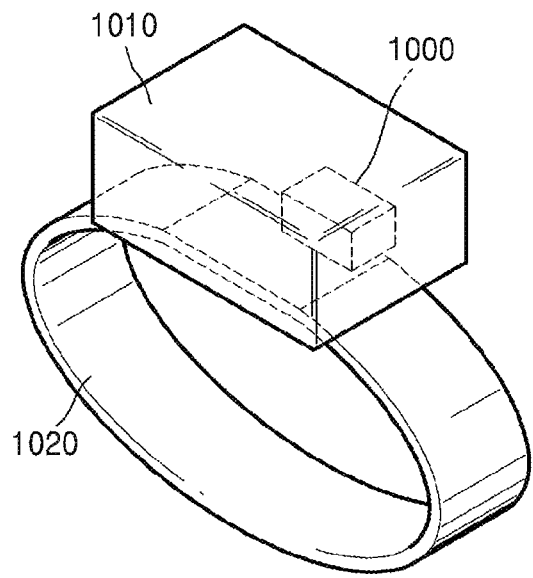
FIG. 29 is a perspective view of a mobile device according to another exemplary embodiment.

FIG. 29 is a perspective view of a mobile device according to another exemplary embodiment.

Referring to FIG. 29, the mobile device includes a mobile device body 1010, a support 1020 supporting the mobile device body 1010, and an energy harvester 1000 provided in the mobile device body 1010. FIG. 29 illustrates a case in which the support 1020 has a band-type structure. However, exemplary embodiments are not limited thereto, and the support 1020 may have a flat-plate structure or another structure.

The energy harvester 1000 is provided in the mobile device body 1010. The energy harvester 1000 may include the energy harvester 700 illustrated in FIG. 25 or the energy harvester 600 illustrated in FIG. 28. Referring to FIG. 25 or 28, the energy harvester 700 or 600 includes a substrate 710 or 610 having a tube shape and a cavity 740 or 640 formed therein; at least one first electrode 731 or 631 and at least one second electrode 732 or 632 provided on an outer surface of the substrate 710 or 610; a triboelectric layer 720 or 620 provided on an inner surface of the substrate 710 or 610; and a mass M provided inside the triboelectric layer 720 or 620. Since the energy harvester 700 or 600 illustrated in FIG. 25 or 28 have been described above in detail, a detailed description thereof will be omitted here.

When the mobile device is moved by the external environment (e.g., movement of a human body, mechanical vibration, wind, water flow, or electromagnetic vibration), the energy harvester 1000 may generate electric energy when the mass M moves in the cavity 740 or 640 of the substrate 710 or 610. The generated electric energy may be supplied to the mobile device body 1010, or may be stored in a battery. In the present embodiment, the energy harvester 1000 is provided in the mobile device body 1010. However, the energy harvester 1000 may be provided in the support 1020 or may be provided in the mobile device body 1010 and the support 1020 The energy harvester 1000 may be provided on or in the mobile device body 1010 or may be provided on or in the support 1020.

Figure 30:
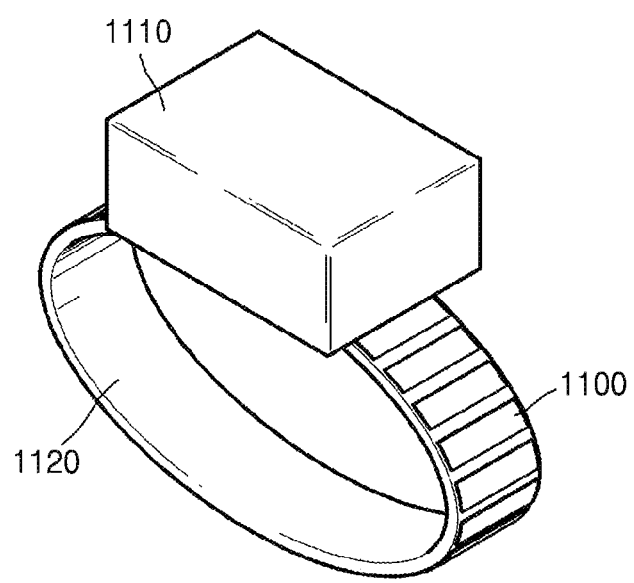
FIG. 30 is a perspective view of a mobile device according to another exemplary embodiment.

FIG. 30 is a perspective view of a mobile device according to another exemplary embodiment.

Referring to FIG. 30, the mobile device includes a mobile device body 1110 and a support 1120 supporting the mobile device body 1110. FIG. 30 illustrates a case in which the support 1120 has a band-type structure. However, embodiments of the present invention are not limited thereto, and the support 1120 may have a flat-plate structure or another structure.

The support 1120 includes a plurality of energy harvesters. Herein, the energy harvesters are connected in parallel with each other. Each of the energy harvesters may include the energy harvester 700 illustrated in FIG. 25 or the energy harvester 600 illustrated in FIG. 28. Referring to FIG. 25 or 28, the energy harvester 700 or 600 includes a substrate 710 or 610; at least one first electrode 731 or 631 and at least one second electrode 732 or 632 provided on an outer surface of the substrate 710 or 610; a triboelectric layer 720 or 620 provided on an inner surface of the substrate 710 or 610; and a mass M provided inside the triboelectric layer 720 or 620. Since the energy harvester 700 or 600 illustrated in FIG. 25 or 28 have been described above in detail, a detailed description thereof will be omitted here.

When the mobile device is moved by the external environment (e.g., movement of a human body, mechanical vibration, wind, water flow, or electromagnetic vibration), each of the energy harvesters 1000 may generate electric energy when the mass M moves in the cavity 740 or 640 of the substrate 710 or 610. The energy harvesters 1000 may be connected in series to each other in order to increase the amount of generated electric energy, but exemplary embodiments are not limited thereto. The generated electric energy may be supplied to the mobile device body 1110, or may be stored in a battery.

Figure 31:
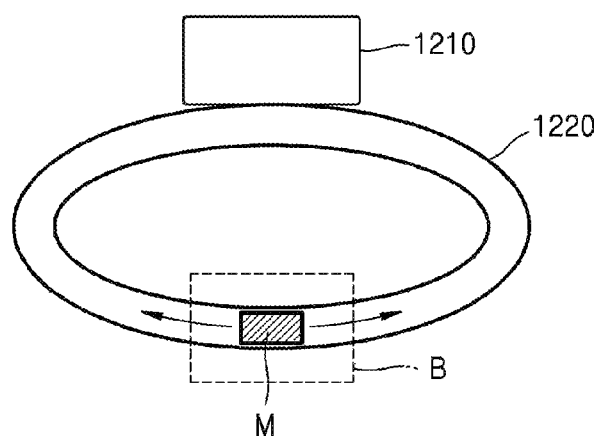
FIG. 31 is a cross-sectional view of a mobile device according to another exemplary embodiment.
Figure 32:
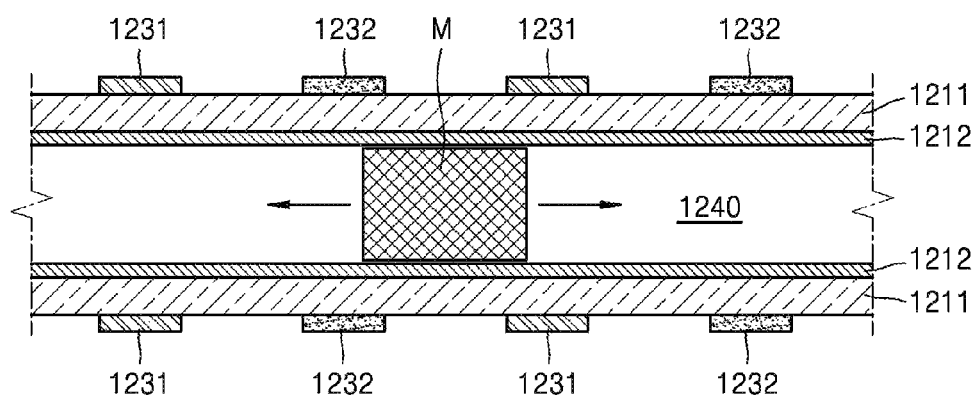
FIG. 32 is an enlarged view of a portion B of FIG. 31.

FIG. 31 is a cross-sectional view of a mobile device according to another exemplary embodiment. FIG. 32 is an enlarged view of a portion B of FIG. 31.

Referring to FIGS. 31 and 32, the mobile device includes a mobile device body 1210 and a support 1220 supporting the mobile device body 1210. The support 1220 may include a plurality of energy harvesters. The energy harvester included in the support 1220 is substantially identical to the energy harvester 700 or 600 illustrated in FIG. 25 or 28, with the exception that a tube-shaped substrate 1211 constitutes a closed circuit.

The support 1220 includes a substrate 1211 having a tube shape and constituting a closed circuit; a triboelectric layer 1212 provided on an inner surface of the substrate 1211; at least one first electrode 1231 and at least one second electrode 1232 provided on an outer surface of the substrate 1211; and a mass M provided inside the triboelectric layer 1212. Herein, the mass M is movable within a cavity 1240 that is formed in the substrate 1211.

When the mobile device is moved by the external environment (e.g., movement of a human body, mechanical vibration, wind, water flow, or electromagnetic vibration), the energy harvester included in the support 1220 may generate electric energy when the mass M moves in the cavity 1240 of the substrate 1211. The generated electric energy may be supplied to the mobile device body 1210, or may be stored in a battery.

According to the above-described exemplary embodiments, when the mass and/or the mobile device are/is moved by the external environment (e.g., movement of a human body, mechanical vibration, wind, water flow, or electromagnetic vibration), the energy harvester may generate electric energy by using a mechanical force applied to the energy harvester. The generated electric energy may be supplied to the mobile device body that is the mass M, or may be stored in the battery. The mobile device may be applied to any of various fields, such as, for example, a smart watch, an MP3 player, a Bluetooth device, a mobile phone, a radio, a biosensor, a position sensor, a body temperature sensor, and a blood pressure sensor, which are attached to a human body. While exemplary embodiments have been described above, those of ordinary skill in the art will understand that various modifications may be made in the embodiments.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. An energy harvester comprising:
   a mass;
   a first substrate and a second substrate spaced apart from the first substrate, wherein one of the first substrate and the second substrate is connected to the mass;
   a first electrode disposed on the first substrate and a second electrode disposed on the second substrate; and
   an energy generator connected between the first electrode and the second electrode, wherein the energy generator generates electric energy upon a relative movement between the first substrate and the second substrate caused by a movement of the mass,
   wherein the energy generator comprises a triboelectric generator,
   wherein the triboelectric generator comprises:
      a first triboelectric layer provided on the first electrode and comprising a first dielectric or a metal; and
      a second triboelectric layer provided on the second electrode and comprising a second dielectric that is different from the first dielectric.

2. The energy harvester of claim 1, wherein the first substrate and the second substrate each are in a shape of a band-type structure, a flat-plate structure, or a core-shell structure.

3. The energy harvester of claim 1, wherein the energy generator further comprises a piezoelectric generator.

4. The energy harvester of claim 3, wherein the piezoelectric generator comprises a plurality of piezoelectric nanowires provided between the first electrode and the second electrode.

5. The energy harvester of claim 4, wherein the piezoelectric generator further comprises a dielectric film provided between the second electrode and the plurality of piezoelectric nanowires.

6. The energy harvester of claim 3, wherein the piezoelectric generator comprises a piezoelectric thin-film layer provided between the first electrode and the second electrode.

7. The energy harvester of claim 1, wherein the triboelectric generator further comprises a plurality of first protrusions formed on a surface of the first triboelectric layer, and a plurality of second protrusions formed on a surface of the second triboelectric layer.

8. The energy harvester of claim 1, wherein the first triboelectric layer comprises a plurality of first wires provided on the first electrode, and the second triboelectric layer comprises a plurality of second wires provided on the second electrode.

9. The energy harvester of claim 1, wherein the first triboelectric layer comprises a plurality of first lines parallel to each other and provided on the first electrode, and the second triboelectric layer comprises a plurality of second lines parallel to each other and provided on the second electrode.

10. The energy harvester of claim 1, wherein the first triboelectric layer comprises a plurality of first lines extending radially on the first electrode, and the second triboelectric layer comprises a plurality of second lines extending radially on the second electrode.

11. The energy harvester of claim 1, wherein a distance between the first triboelectric layer and the second triboelectric layer is about 0 mm to about 10 mm.

12. The energy harvester of claim 1, further comprising at least one spacer provided between the first substrate and the second substrate.

13. A mobile device comprising:
a mobile device body;
a support which supports the mobile device body; and
an energy harvester provided in at least one of the mobile device body and the support, wherein the energy harvester generates electric energy upon application of a mechanical force on at least one of the mobile device body,
wherein the energy harvester comprises:
  a mass;
  a first substrate and a second substrate spaced apart from the first substrate, wherein one of the first substrate and the second substrate is connected to the mass;
  a first electrode disposed on the first substrate and a second electrode disposed on the second substrate; and
  an energy generator connected between the first electrode and the second electrode, wherein the energy generator generates electric energy upon a relative movement between the first substrate and the second substrate caused by a movement of the mass,
wherein the energy generator comprises a triboelectric generator,
wherein the triboelectric generator comprises:
  a first triboelectric layer provided on the first electrode and comprising a first dielectric or a metal; and
  a second triboelectric layer provided on the second electrode and comprising a second dielectric that is different from the first dielectric.

14. The mobile device of claim 13, wherein the support comprises one of a band-type structure and a flat-plate structure.

15. The mobile device of claim 13, wherein the energy generator further comprises a piezoelectric generator.

16. The mobile device of claim 15, wherein the piezoelectric generator comprises a plurality of piezoelectric nanowires provided between the first electrode and the second electrode.

17. The mobile device of claim 16, wherein the piezoelectric generator further comprises a dielectric film provided between the second electrode and the plurality of piezoelectric nanowires.

18. The mobile device of claim 15, wherein the piezoelectric generator comprises a piezoelectric thin-film layer provided between the first electrode and the second electrode.

19. The mobile device of claim 13, wherein the triboelectric generator further comprises a plurality of first protrusions formed on a surface of the first triboelectric layer, and a plurality of second protrusions formed on a surface of the second triboelectric layer.

20. The mobile device of claim 13, wherein the first triboelectric layer comprises a plurality of first wires provided on the first electrode, and the second triboelectric layer comprises a plurality of second wires provided on the second electrode.

21. The mobile device of claim 13, wherein the first triboelectric layer comprises a plurality of first lines parallel to each other and provided on the first electrode, and the second triboelectric layer comprises a plurality of second lines parallel to each other and provided on the second electrode.

22. The mobile device of claim 13, wherein the first triboelectric layer comprises a plurality of first lines extending radially on the first electrode, and the second triboelectric layer comprises a plurality of second lines extending radially on the second electrode.

23. A mobile device comprising:
a mobile device body;
a support which supports the mobile device body; and
an energy harvester provided in at least one of the mobile device body and the support, wherein the energy harvester generates electric energy upon application of a mechanical force on at least one of the mobile device body,
wherein the energy harvester comprises:
  a substrate having a tube shape and a cavity formed therein;
  a triboelectric layer provided on an inner surface of the substrate;
  at least one first electrode and at least one second electrode disposed on the substrate; and
  at least one mass which is movable along a longitudinal direction of the cavity inside the triboelectric layer in the cavity,
wherein when the at least one mass and the triboelectric layer rub against each other or a distance difference occurs between the at least one mass and the triboelectric layer, electric energy is generated between the at least one first electrode and the at least one second electrode due to a charge density difference occurred between the at least one mass and the triboelectric layer.

24. The mobile device of claim 23, wherein the substrate is provided such that the cavity constitutes a closed circuit.

25. The mobile device of claim 13, wherein the support comprises a plurality of energy harvesters that are connected in parallel to each other.

26. The mobile device of claim 13, wherein the support comprises a plurality of energy harvesters that are connected in series with each other.

27. The mobile device of claim 23, wherein one of the triboelectric layer and the at least one mass comprises a first dielectric or a metal, and the other of the triboelectric layer and the at least one mass comprises a second dielectric that is different from the first dielectric.

* * * * *